United States Patent
Goldfine et al.

(10) Patent No.: US 6,380,747 B1
(45) Date of Patent: Apr. 30, 2002

(54) METHODS FOR PROCESSING, OPTIMIZATION, CALIBRATION AND DISPLAY OF MEASURED DIELECTROMETRY SIGNALS USING PROPERTY ESTIMATION GRIDS

(75) Inventors: Neil J. Goldfine, Newton; Markus Zahn, Lexington; Alexander V. Mamishev, Cambridge; Darrell E. Schlicker, Watertown, all of MA (US); Andrew P. Washabaugh, Menlo Park, CA (US)

(73) Assignee: Jentek Sensors, Inc., Waltham, MA (US)

( * ) Notice: Subject to any disclaimer, the term of this patent is extended or adjusted under 35 U.S.C. 154(b) by 0 days.

(21) Appl. No.: 09/310,507

(22) Filed: May 12, 1999

Related U.S. Application Data

(60) Provisional application No. 60/085,201, filed on May 12, 1998.

(51) Int. Cl.$^7$ .......................... G01R 29/08; G01N 27/72
(52) U.S. Cl. ........................ 324/457; 324/235; 324/238; 324/671; 324/688
(58) Field of Search .................................. 324/457, 458, 324/228, 229, 235, 238, 239, 240, 750, 663, 671, 686, 688

(56) References Cited

U.S. PATENT DOCUMENTS

| 3,939,404 A | 2/1976 | Tait ............................. 324/40 |
| 4,058,766 A | 11/1977 | Vogel et al. ................... 324/61 |

FOREIGN PATENT DOCUMENTS

| EP | 0 242 947 A2 | 10/1987 |
| EP | 0 723 166 A1 | 7/1996 |
| GB | 2 031 155 A | 4/1980 |
| RU | 1095101 A | of 1984 |
| WO | WO 92-03090 | 3/1992 |
| WO | 93/11426 | 6/1993 |
| WO | WO97/01739 | 1/1997 |
| WO | 98/30921 | 7/1998 |
| WO | 98/40732 | 9/1998 |
| WO | 99/22231 | 5/1999 |
| WO | 99/26062 | 5/1999 |

OTHER PUBLICATIONS

Goldfine, Neil et al., "Dielectrometers and magnetometers, suitable for in–situ inspection of ceramic and metallic coated components," SPIE Conference, Jun. 1995, 11 pages.
Goldfine, Neil et al., "A New Eddy–Current Based Technology for Repeatable Residual Stress and Age Degradation Monitoring," ASNT International Chemical and Petroleum Industry Inspection Technology IV, Houston, TX Jun. 19–22, 1995, 5 pages.

(List continued on next page.)

Primary Examiner—Glenn W. Brown
(74) Attorney, Agent, or Firm—Hamilton, Brook, Smith & Reynolds, P.C.

(57) ABSTRACT

A method is disclosed for processing, optimization, calibration, and display of measured dielectrometry signals. A property estimator is coupled by way of instrumentation to an electrode structure and translates sensed electromagnetic responses into estimates of one or more preselected properties or dimensions of the material, such as dielectric permittivity and ohmic conductivity, layer thickness, or other physical properties that affect dielectric properties, or presence of other lossy dielectric or metallic objects. A dielectrometry sensor is disclosed which can be connected in various ways to have different effective penetration depths of electric fields but with all configurations having the same air-gap, fluid gap, or shim lift-off height, thereby greatly improving the performance of the property estimators by decreasing the number of unknowns. The sensor geometry consist of a periodic structure with, at any one time, a single sensing element that provides for multiple wavelength within the same sensor footprint.

8 Claims, 18 Drawing Sheets

U.S. PATENT DOCUMENTS

| | | | |
|---|---|---|---|
| 4,355,300 A | 10/1982 | Weber | 340/146.3 |
| 4,423,371 A | 12/1983 | Senturia et al. | 324/61 |
| 4,757,259 A | 7/1988 | Charpentier | 324/227 |
| 4,799,010 A | 1/1989 | Muller | 324/240 |
| 4,810,966 A | 3/1989 | Schmall | 324/207 |
| 4,814,690 A | 3/1989 | Melcher et al. | 324/61 |
| 4,853,617 A | 8/1989 | Douglas et al. | 324/67 |
| 4,912,414 A | 3/1990 | Lesky et al. | 324/329 |
| 4,922,201 A | 5/1990 | Vernon et al. | 324/236 |
| 5,015,951 A | 5/1991 | Melcher | 324/232 |
| 5,059,902 A | 10/1991 | Linder | 324/207.17 |
| 5,086,274 A | 2/1992 | Gobin et al. | 324/239 |
| 5,182,513 A | 1/1993 | Young et al. | 324/232 |
| 5,223,796 A | 6/1993 | Waldman et al. | 324/687 |
| 5,237,271 A | 8/1993 | Hedengren | 324/232 |
| 5,278,498 A | 1/1994 | Vernon et al. | 324/234 |
| 5,293,119 A | 3/1994 | Podney | 324/242 |
| 5,315,234 A | 5/1994 | Sutton, Jr. et al. | 324/242 |
| 5,345,514 A | 9/1994 | Mahdavieh et al. | 382/8 |
| 5,363,051 A | 11/1994 | Jenstrom et al. | 324/661 |
| 5,371,461 A | 12/1994 | Hendengren | 324/225 |
| 5,371,462 A | 12/1994 | Hedengren et al. | 324/225 |
| 5,389,876 A | 2/1995 | Hedengren et al. | 324/242 |
| 5,418,457 A | 5/1995 | Hedengren et al. | 324/225 |
| 5,436,565 A * | 7/1995 | Gammell | 324/679 |
| 5,453,689 A | 9/1995 | Goldfine et al. | 324/239 |
| 5,459,406 A * | 10/1995 | Louge | 324/688 |
| 5,463,201 A | 10/1995 | Hedengren et al. | 219/121.83 |
| 5,485,084 A | 1/1996 | Duncan et al. | 324/225 |
| 5,541,510 A | 7/1996 | Danielson | 324/233 |
| 5,629,621 A | 5/1997 | Goldfine et al. | 324/239 |
| 5,793,206 A | 8/1998 | Goldfine et al. | 324/242 |
| 5,874,672 A * | 2/1999 | Gerardi et al. | 324/671 X |
| 5,900,736 A * | 5/1999 | Sovik et al. | 324/663 |

OTHER PUBLICATIONS

Krampfner, Yehuda D. and Johnson, Duane D., "Flexible Substrate Eddy Current Coil Arrays," Review of Progress in Quantitative Nondestructive Evaluation, vol. 7A, 1988. pp 471–478, (month unavailable).

Zaretsky, M. et al., "Modal Approach to Obtaining Continuum Properties From Inter–Digital Electrode Dielectrometry," Massachusetts Institute of Technology, Lees Technical Report, Jul. 1986, pp. 1–43.

Dodd, V.C. and Deeds, W.E., "Absolute Eddy–Current Measurement of Electrical Conductivity," From "Review of Progress in Quantitative Nondestructive Evaluation," vol. 1, 1982, pp. 387–394, (month unavailable).

Dodd, C.V. and Simpson, W.A. "Measurement of Small Magnetic Permeability Changes by Eddy Current Techniques," presented at the National Fall Conference of the American Society for Nondestructive Testing, Oct. 19–22, 1970, pp. 217–221.

Auld, B.A. et al., "Eddy–Current Signal Analysis and Inversion for Semielliptical Surface Cracks," Journal of Nondestructive Evaluation, vol. 7, No. 1/2, Apr. 1988, pp. 79–94.

Goldfine, Neil and Roach, Dennis, "Early Stage and Widespread Fatigue Damage Assessment for Aircraft Structures and Engines, Using a New Conformable Multiple–Frequency Eddy Current Sensor," ATA NDT Forum, Indianapolis, IN Sep. 8–11, 1997, pp. 1–13.

Goldfine, Dr. Neil J., "Early Stage Fatigue Detection with Application to Widespread Fatigue Damage Assessment in Military and Commercial Aircraft," DOD/FAA/NASA Conference on Aging Aircraft, Ogden, UT, Jul. 8–10, 1997, pp. 1–10.

Goldfine, Neil J., "Magnetometers for Improved Materials Characterization in Aerospace Applications," Materials Evaluation, Mar. 1993, pp. 396–405.

Goldfine, Neil and Clark, David, "Near Surface Material Property Profiling for Determination of SCC Susceptibility," EPRI Balance–of–Plant Heat Exchanger NDE Symposium, Jackson Hole, WY, Jun. 10–12, 1996.

Morrison, Philip and Tsipis, Kosta, "New Hope in Minefields," Massachusetts Institute of Technology's *Technology Review*, ISSN 0040–1692, vol. 100, No. 7, pp. 38–47, Oct. 1997.

"Innovations in Quantitative Nondestructive Evaluation," JENTEK Sensors, Inc. Brochure, No Date Given.

Goldfine, Neil et al., "Surface–Mounted Eddy–Current Sensors for On–Line Monitoring of Fatigue Tests and For Aircraft Health Monitoring," Second Joint NASA/FAA DoD Conference on Aging Aircraft, Aug. 1998, pp. 1–16.

Goldfine, Neil, "Uncalibrated, Absolute Property Estimation and Measurement Optimization for Conducting and Magnetic Media Using Imposed ω–k Magnetometry," Doctoral Thesis, Cataloged into the Massachusetts Institute of Technology Libraries on Oct. 6, 1992, pp. 1–139.

\* cited by examiner

METHODS FOR PROCESSING, OPTIMIZATION, CALIBRATION AND DISPLAY OF MEASURED DIELECTROMETRY SIGNALS USING PROPERTY ESTIMATION GRIDS

RELATED APPLICATIONS

This application claims the benefit of Provisional Application No. 60/085,201, filed May 12, 1998, the entire teachings of which are incorporated herein by reference.

BACKGROUND OF THE INVENTION

The technical field of this invention is dielectrometry and, in particular, the electromagnetic interrogation of materials of interest to deduce their physical, chemical, geometric, or kinematic properties. The disclosed invention applies to semiconducting, both lossy and lossless dielectric media, very thin metalizations, and shape/proximity measurements for conducting and dielectric objects and surfaces.

Dielectric sensors are commonly used for material property characterization and defect detection in a material under test (MUT). The sensors respond to the absolute properties of the MUT, such as the electrical permittivity, electrical conductivity, thickness, and proximity, and changes in those properties. Factors that affect the dielectric properties include composition, chemistry and the state of cure, density, porosity, and contamination with other substances such as moisture. The property variations may be a normal part of the manufacturing process or a result of the presence of defects or damage. These defects can be created during the manufacturing process, such as improper curing or incorrect layer thickness for stratified media, or when the material is placed into service by use- and/or age-related degradation processes, such as fatigue. In manufacturing, the continuing drive toward defect-free products, yield improvement and operation near the capability limits of the production system require sensing technologies for monitoring as many critical process variables as possible. In operations, service maintenance, and repair and replacement activities, the continuing push toward a retirement-for-cause philosophy from the retire-for-time approach requires reliable measurements on all fatigue-critical components in the system, even at difficult-to-access locations.

Dielectric measurements can be performed with a wide variety of devices. The simplest devices involve parallel plate capacitors where the MUT is placed between a pair of electrodes. Often guard electrodes are used to minimize the effects of fringing electric fields at the electrode edges so that MUT is exposed to an essentially uniform electric field. The electrical terminal admittance or impedance of the device is then related to the material properties through geometric factors associated with the sensor geometry.

In many applications both sides of the MUT are not easily accessible and single-sided sensor configurations are required. A common implementation of a single-sided sensor is the interdigitated electrode structure used for chemical and moisture sensing applications. U.S. Pat. No. 4,814,690 further discloses the use of multiple sets of interdigitated electrodes as part of the imposed frequency-wavenumber dielectrometry approach for spatial profiling of stratified dielectric media. These devices have been effective in determining the dielectric properties of fluids. However, the determination of solid dielectric properties is more complicated due to the presence of microcavities or unintentional air gaps between the solid dielectric and the sensor.

While one can attempt to compensate for the air gap, the thickness is usually unknown and variable across the surface of the sensor. Therefore, effective compensation may be difficult to achieve even with multiple sensors placed onto a single substrate. One of the difficulties is due to the fact that a sensor having a number of sensor elements, each with different electrode spacings, those sensor elements are not co-located and therefore are not located at exactly the same places relative to the MUT.

Generally dielectrometry measurements require solving of an inverse problem relating the sensor response to the physical variables of interest. Such inverse parameter estimation problems generally require numerical iterations of the forward problem, which can be very time consuming often preventing material identification in real-time. Real-time parameter estimations often need to be provided for such applications as manufacturing quality control. In some cases, simple calibration procedures can be applied, but these suffer from requiring and assuming independent knowledge about the properties. More advanced model-based techniques utilize multivariable parameter estimation algorithms to estimate the properties of interest, but these are generally slow, precluding real-time measurement capabilities, and may not converge on the desired solution.

SUMMARY OF THE INVENTION

The present invention comprises of a method for generating property estimates of one or more preselected properties or dimensions of a material. Specific embodiments of the methods are disclosed for generating, calibrating, measuring properties with, and selecting among two-dimensional response databases, called measurement grids, for both single wavelength dielectrometry applications and multiple wavelength dielectrometry applications.

One step in a preferred method requires defining or estimating the range and property estimate tolerance requirements for the preselected properties or dimensions of the material under test. The next step is the selecting at least one of each of an electrode geometry, configuration, excitation source, and measurement instrument operating point. A continuum model, either analytical or numerical or an experimental approach using calibration test pieces of known properties and dimensions or both are then used to generate measurement grids as well as operating point response curves for preselected operating point parameters.

The measurement grids and operating point response curves are subsequently analyzed to define a measurement strategy. Operating point parameters and an electrode geometry, configuration, and excitation source are then determined to meet the dynamic range and tolerance requirements. To accomplish this, property estimation grids and operating point response curves are generated and analyzed for various operating points. The sensitivity and selectivity is calculated for grids representing varying electrode designs and operating conditions. Then the best of the lot of pre-chosen design parameters and operating conditions are selected. If inadequate to requirements, this evaluation process can be reiterated with improved selections based on what was learned in prior rounds.

A property estimator implements a model for generating a property estimation grid, which translates sensed responses into preselected material property or dimension estimates. Accordingly, the present invention includes a method for generating a property estimation grid for use with a dielectrometer for estimating preselected properties or dimensions of a material under test. The first step in generating a grid is defining physical and geometrical properties of the MUT and the electrode geometry, configuration, and source excitation for the dielectrometer are defined.

The material properties, the operating point parameters, and the dielectrometer electrode geometry, configuration, and source excitation are input into a model to compute an input/output terminal relation value. In a preferred embodiment, the input/output terminal relation is a value of transadmittance magnitude and phase. The terminal relation value is then recorded and the process is repeated after incrementing the preselected properties of the material under test. After a number of iterations, the terminal relation values are saved in a database of material responses and plotted to form a property estimation grid.

A preferred embodiment of the method according to the invention includes the incorporation of geometric properties into the grid databases for the representation of multi-layered media and the use of analytic properties of the measurement grid to map from measurement space to property space, such as singular value decomposition, condition numbers (and visualizations of these), to improve selection amongst alternative sensor designs and operating conditions. In addition, the preferred embodiment uses methods for measuring with and calibrating dielectrometers, using single and multiple grids for multiple wavenumber dielectrometry. Exploiting the characterization and understanding of other properties of such mappings to aid in choosing and selecting among measurement grid alternatives is also feasible.

A preferred method of the invention includes enhancing sensitivity and selectivity by using fluids or solids of known properties and dimensions to intentionally move the sensor response within the grid or to alter the grid itself. Movement within grids can also be achieved by varying other parameters such as temperature that also affect permittivity. The method supports both measurement and calibration. One method uses "shims" of known dielectric constant, conductivity, and thickness between the sensor and the material under test.

The need is also recognized for a sensor device configuration that reduce the sensor sensitivity to undesired inhomogenities across the face of the sensor. In a preferred embodiment, a sensor has multiple electric field penetration depths but each with the same air-gap, fluid gap, or shim lift-off height, thereby greatly reducing the number of unknowns in parameter estimation algorithms.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Methods, techniques, and devices are disclosed for measurements of electrical, physical, and dimensional properties of a material under test as well as geometric and kinematic properties of the measurement arrangement. These measurements are made with both contact and non-contact of the material under test by a sensor. For contact measurements, the sensor may be embedded in material under test (MUT).

Figure 1:
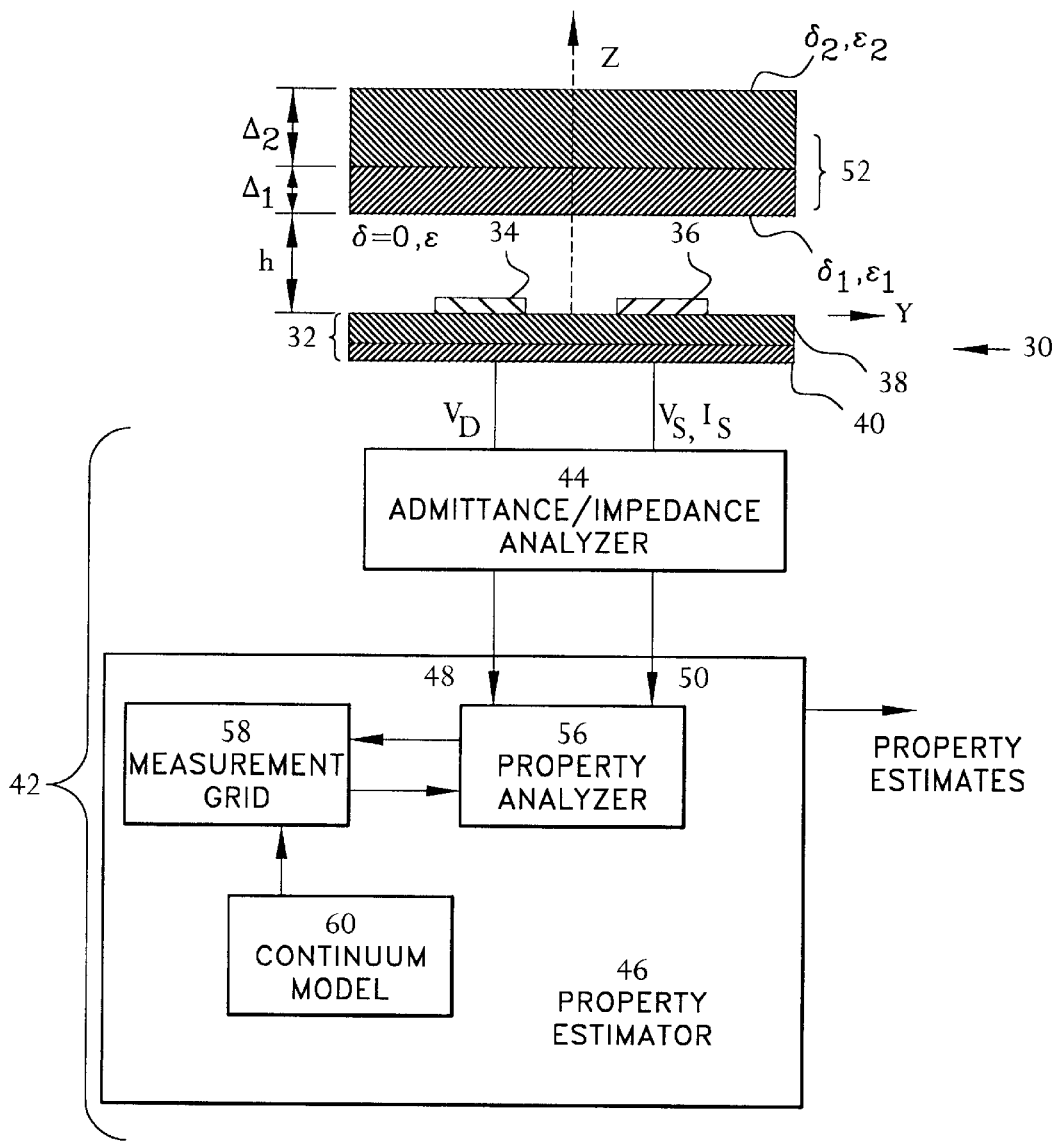
FIG. 1 is an overall schematic diagram of an apparatus for measuring the electrical, physical, and geometrical properties of a material under test according to the present invention.

A measurement apparatus 30 is illustrated in FIG. 1. The measurement apparatus 30 includes an electromagnetic element 32 comprised of voltage driven electrode 34, voltage or current sensing electrode 36, a dielectric substrate 38 that is preferably highly electrically insulating, and a highly conducting back plane 40.

The driven electrode 34 has an imposed electrical excitation, typically either a voltage or current that can be either periodically varying in time such as sinusoidally or square wave varying with time at frequency f measured in Hertz for frequency domain measurements or can be a non-repetitive voltage or current signal such as a step, pulse, or impulse for time domain measurements. Measurement of the electrical response, typically voltage or current, induced in the sensing electrode 36 allows calculation or measurement of the transadmittance (or transfer admittance), or alternatively the transimpedance, or complex gain (i.e., either a Vout/Vin or Iout/Iin measure) between sensing and driven electrodes. The transadmittance is measured by the admittance analyzer 44 or an impedance analyzer.

The measurement apparatus 30 is connected to an analyzer 42. The analyzer 42 has an admittance analyzer 44 and a property estimator 46. Either the current $I_s$ or the voltage, $V_s$, of the sensing electrode or some combination of the two can be used in this measurement. The magnitude 48 and phase 50 of measured transadmittances, which is generated by the admittance analyzer 44, are used to estimate preselected properties or dimensions of a single, multiple layered, or continuously stratified material under test 52. The properties or dimensions are estimated, using a property analyzer 56 of the property estimator 46. The property analyzer 56 of the property estimator 46 interacts with a measurement grid 58 of the property estimator. The measurement grid 58 represents properties of the material. The measurement grid 58 can be generated with continuum analytical or numerical models 60 or through experimental measurements on calibration test pieces with known geometry and electrical properties or both An example of a measurement grid 58 is shown in FIGS. 5A, 5B, 6–8, 11–14, and 21 and disclosed in U.S. Pat. No. 5,453,689, Sep. 26, 1995, titled "Magnetometer Having Periodic Winding Structure and Material Property Estimator," the entire contents of which are incorporated herein by reference. The model 60, measurement grid(s) 58, and property analyzer 56 are part of the property estimator 46 that converts measurements at the sensor terminals for single or multiple operating points (e.g. multiple temporal excitation frequencies or multiple types of time varying waveforms) to estimate pre-selected material under test properties or dimensions of interest.

Through proper design and selection of the electromagnetic elements 32, methods for proper selection of operating point(s) parameters and methods for selection of measurement details, e.g., instruments and their operating points, choice of measured values, grids used increase sensitivity, selectivity, and dynamic and other ranges of property estimation.

This increased capability through the selection of the elements, points, and properties as explained below results in measurement of properties and or dimensions of interest for the material under test which are not measurable with traditional electrode structures.

Figure 13:
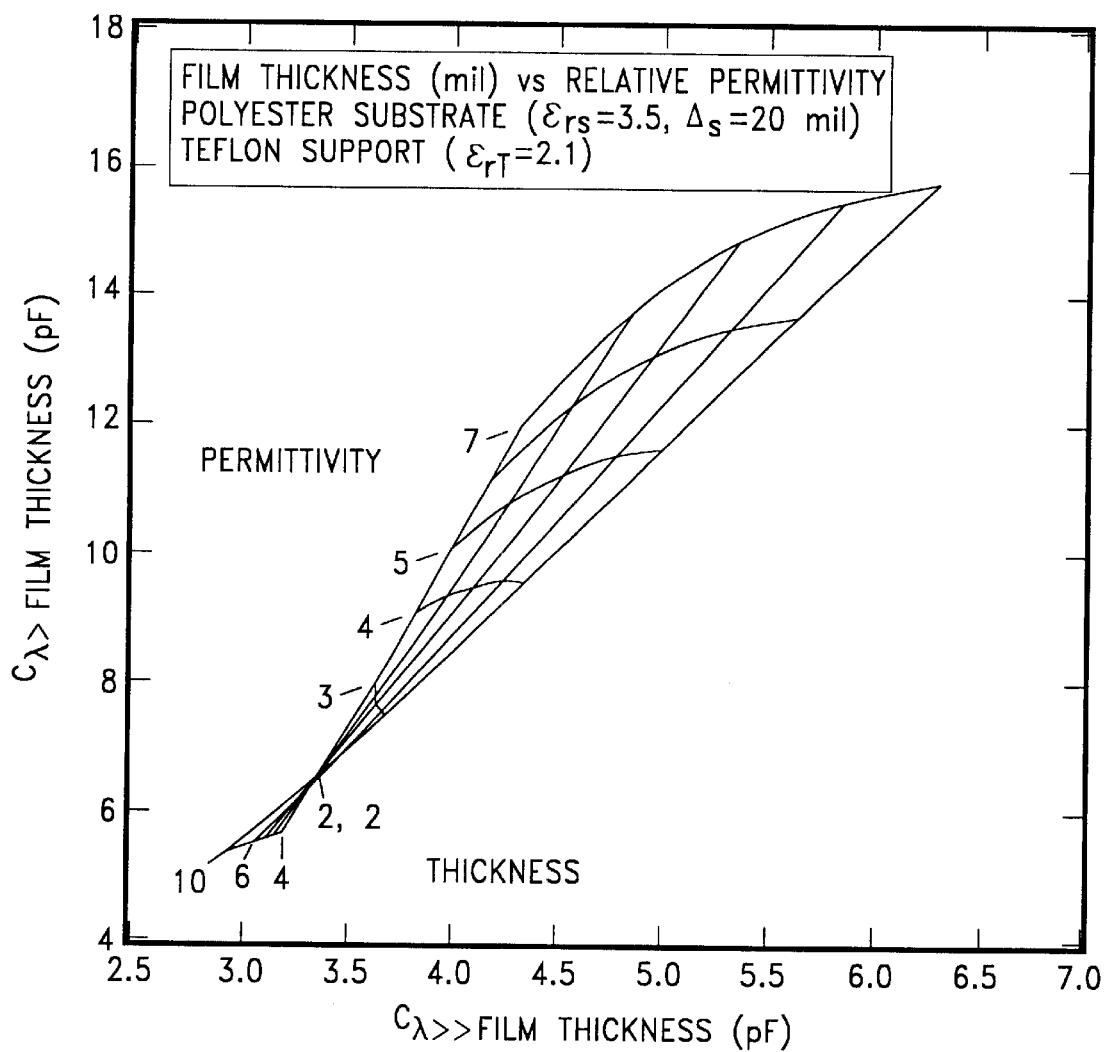
FIG. 13 shows a grid used to measure a dielectric coating layer's thickness and permittivity in a contact measurement.

The grid measurement methods provide a real-time capability for solving the inverse problem relating the material properties to the sensor response. These grid measurement methods use a database of sensor responses to map the measured signals into the desired properties for the material. The database is derived, prior to the data acquisition, using a "forward model" of the sensor response using either a continuum model or a finite element or other numerical method for the sensor and the specific problem of interest and/or a preselected set of calibration experiments. The measurement databases can be visualized as grids, as seen in FIG. 13, that relate measured parameters, such as the magnitude and phase of the impedance, to the unknown parameters, such as the permittivity and thickness of a dielectric layer.

These measurement methods are applied to capacitive sensing dielectrometry, where the dielectric properties of a material can be described by two parameters, the permittivity and conductivity. The permittivity is a constitutive parameter that relates the displacement current density in the material to the applied electric field, whereas the conductivity applies to the conduction current density. The dielectric properties of materials vary significantly and can provide a means for characterization of the materials and their geometric properties such as size or layer thickness.

It is convenient to represent the complex permittivity of a material as $\epsilon^* = \epsilon' - j\epsilon''$, where $\epsilon'$ is the real part and $\epsilon''$ is the imaginary part of the complex permittivity. The real part is the dielectric constant, or permittivity, of the material ($\epsilon' = \epsilon$); whereas, the imaginary part ($\epsilon'' = \sigma/\omega$ where $\upsilon$ is the conductivity and $\omega$ is the angular frequency of the electric field) describes the power dissipation or loss of the material. The dielectric spectrum of a material is a representation of its complex permittivity, expressed as a function of frequency. The dielectric spectrum provides a signature of a material in a particular state.

Classical dielectrometry extracts information about the state of a material construct from its dielectric spectrum The application of a sinusoidally varying potential of complex magnitude v and angular frequency $\omega = 2\pi f$ results in the flow of a terminal current with complex amplitude I, whose magnitude and phase are dependent on the complex permittivity of the material.

Figure 2:
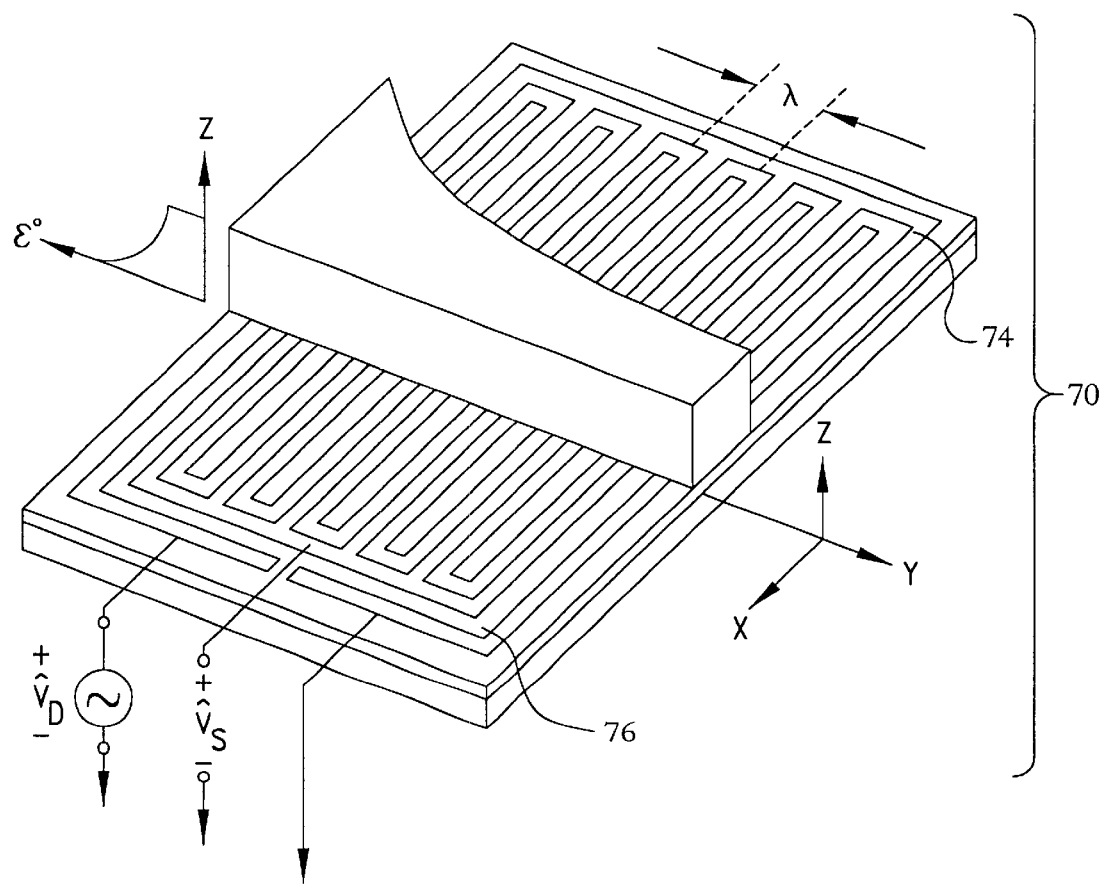
FIG. 2 is a representative single wavelength interdigitated electrode dielectrometer with spatially periodic driven and sensing electrodes of wavelength λ that can measure dielectric properties of the adjacent material.

Referring to FIG. 2, an interdigitated electrode dielectrometer (IDED) capacitive sensor 70 is illustrated. The IDED 70 utilizes a pair of interdigitated electrodes 74 and 76 to produce a spatially periodic electric field. The electrodes 74 and 76 are positioned in proximity to the material of interest or under test with an insulating substrate 38 and a ground plane electrode 40 on the other side of the substrate, as seen in FIG. 1. One of the two interdigitated electrodes, 74, is driven with a sinusoidally varying voltage, vD, (the driven electrode 34) while the other, 76, is connected to a known load impedance and high-input-impedance voltage buffer stage used to measure the magnitude and phase of the potential, vS, (the sensing electrode 36) with respect to the driving voltage vD. The periodicity of the electrode structure is denoted by the spatial wavelength $\lambda = 2\pi/\kappa$, where $\kappa$ is the wavenumber. An interdigitated electrode dielectrometer (IDED) sensor is also described in U.S. Pat. No. 4,814,690, "Apparatus and Methods for Measuring Permittivity in Materials," of Mar. 21, 1989, the entire contents of which are incorporated herein by reference.

The depth of sensitivity of the sensor is determined by the electrode spacing. The electric scalar potential in the materials above and below the sensor obeys Laplace's equation.

In Cartesian coordinates with linear lossy dielectrics the potential can be written as an infinite series of sinusoidal Fourier modes of fundamental spatial wavelength 1 that decays away in the z direction $$\Phi(y, z) = \sum_{n=0}^{\infty} \Phi_n e^{-k_n z}(A_n \sin k_n y + B_n \cos k_n y) \quad (1)$$

where $k_n = 2\pi n/\lambda$ is the wavenumber of mode n. The periodicity of the electrode structure leads to sinusoidal variations in the y direction and exponential decay in the z direction for penetration into the dielectric MUT. For every mode the decay rate in the z direction is equal to the wavenumber $k_n$ of the variations in the y direction.

Figure 3A:
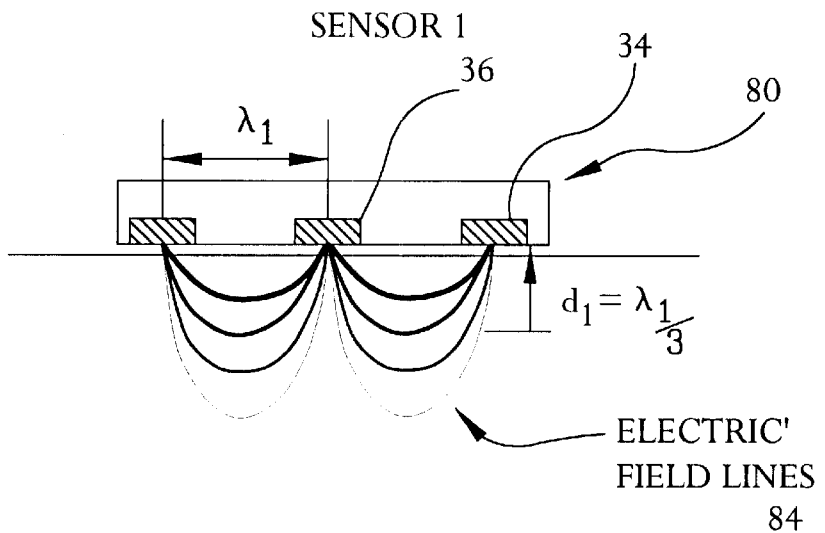
FIGS. 3A and 3B show two IDED sensors with different electrode wavelengths and illustrates that the penetration depth of electric field into the material is proportional to the wavelength.
Figure 3B:
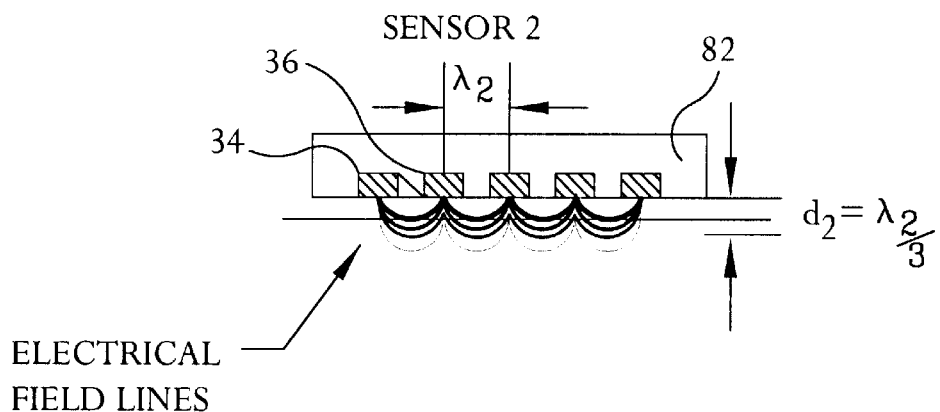

FIGS. 3A and 3B illustrates two sensors 80 and 82. Each sensor shows driven electrodes 34 and sensing electrodes 36. Sensor 80 shown in FIG. 3A, has a distance between the electrodes 34 and 36 of $\lambda_1$ (a wavelength), wherein the distance between the electrodes 34 and 36 are illustrated as less and $\lambda_2$ in FIG. 3B. The electric field 84 penetration depth into a material under test (MUT) increases with increasing sensor wavelength.

Figure 4:
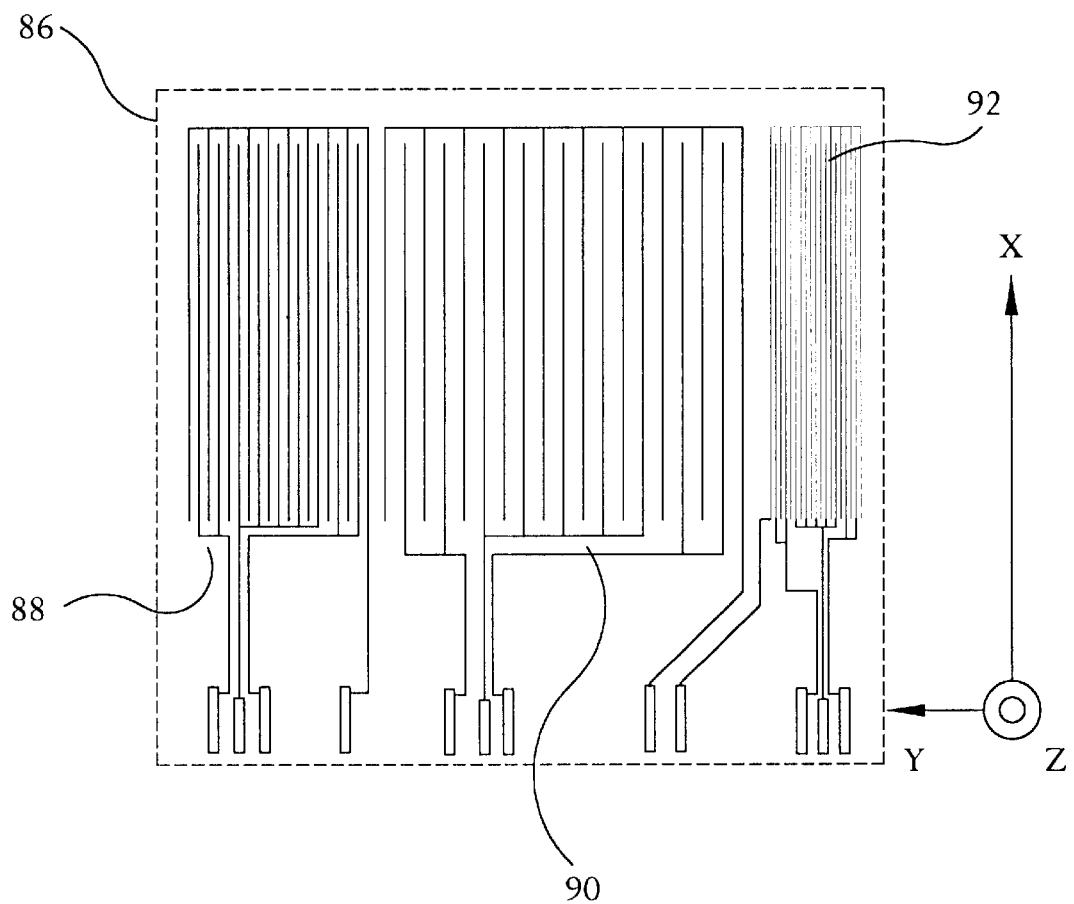
FIG. 4 illustrates a three wavelength sensor on a single substrate with each sensor having a different wavelength.

A three wavelength sensor 86 is shown in FIG. 4. The sensor 36 has three distinct sensors 88, 90, and 92. Each sensor is an IDED sensor with a driven electrode and a sensing electrode. In a preferred embodiment, the wavelength of the sensors 88, 90, and 92 are 2.5 mm, 5 mm, and 1 mm respectively. The three wavelength sensor is used for heterogeneous media, spatial profiles of dielectric properties or layer thickness.

Measurement of the gain and phase, the real and imaginary parts of the transadmittance between the driven and the sensing electrodes, or the transconductance and transcapacitance, provides two parameters which can be related to conductivity and dielectric permittivity of a material. Liquid and gaseous dielectrics are most suitable for this type of measurement because the fluid conforms to the sensor surface. This eliminates the uncertainty in geometry that can exist for measurements with solid dielectrics due to surface roughness and deformation of the solid material and sensor electrodes. Alternatively, the comb-serpentine-comb structure disclosed herein allows for improved accuracy in the determination of the properties of solid dielectrics by allowing different depths of penetration to be achieved within the same sensor footprint. An alternative method to achieve multiple sensing wavelengths is disclosed in U.S. patent application Ser. No. 09/003,390, filed on Jan. 6, 1998, now U.S. Pat. No. 6,144,206, titled "Magnetometer and Dielectrometer Detection of Subsurface Objects," the entire contents of which are incorporated herein by reference.

Figure 5A:
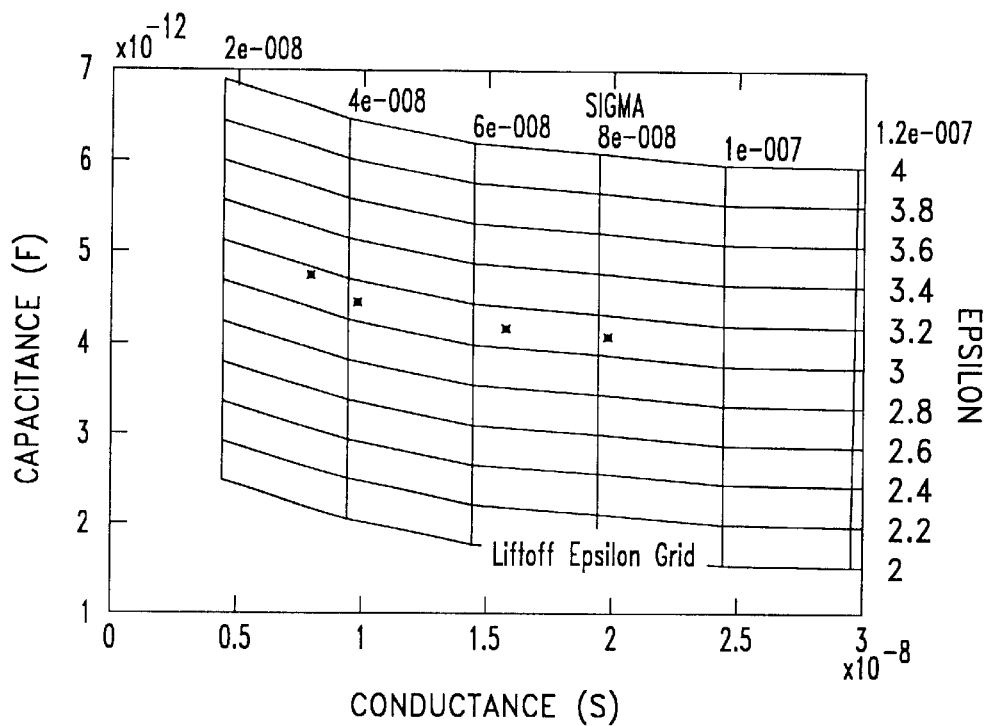
FIG. 5A shows a property estimation grid for measurement of dielectric permittivity epsilon and ohmic conductivity sigma for a single 2.5 mm wavelength sensor.

FIG. 5A shows a property estimation grid generated for 2.5 mm wavelength interdigital sensor immersed in a liquid dielectric. The properties of the liquid dielectric are to be estimated. The liquid dielectric, whose properties can range from simi-insulating (such as mineral oil) to conducting (such as aqueous solutions), flows around the sensor and allows for intimate contact between the sensor, the surfaces and MUT. The total sensing electrode length was assumed to be 0.5 m. Variation of the calculated conductance and capacitance with the properties of the dielectric is reflected in the grid by plotting lines of constant dielectric permittivity "epsilon" and conductivity "sigma". In this example, the conductivity is dependent on temperature while the permittivity has negligible variation with temperature. The dielectric properties are monitored as temperature changes. Several measurement points are indicated on the grid in FIG. 5A with the "*" sign. The experimental points fall along a constant "epsilon" line indicating changes in "sigma" only. The measured values of "sigma" can be obtained by interpolating between constant "sigma" grid lines.

Figure 7:
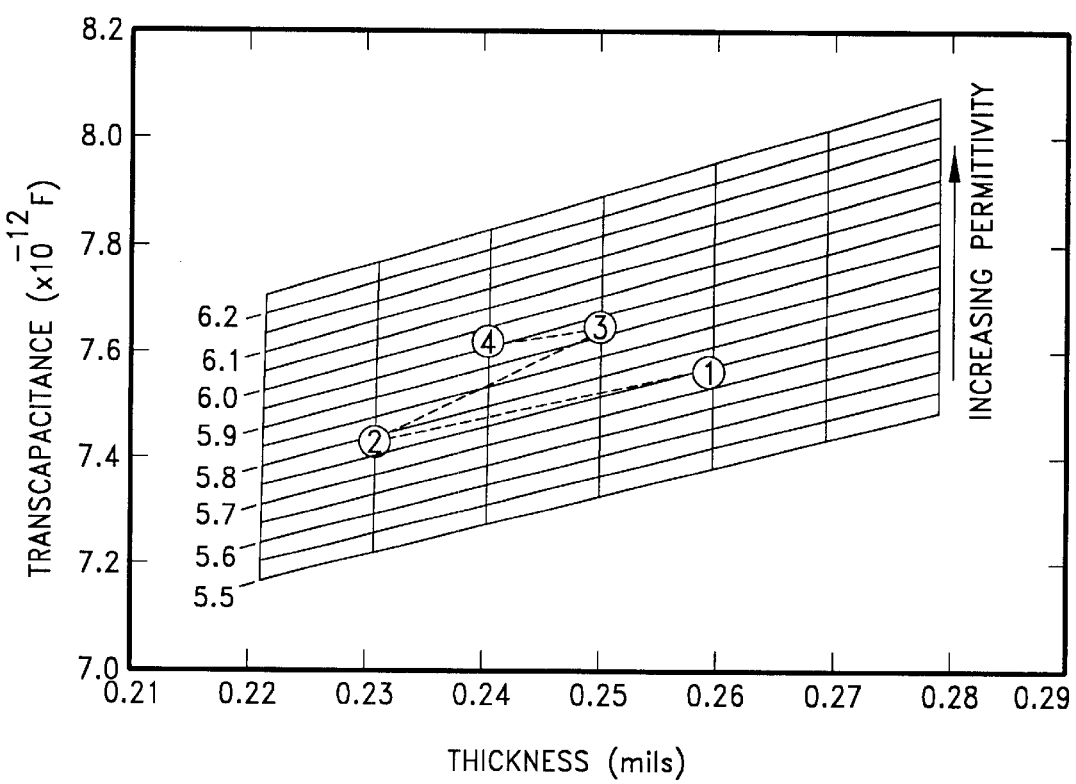
FIG. 7 shows a property estimation grid for the dielectric permittivity and thickness of a dielectric layer sandwiched between two dielectrics having known properties and over an insulating substrate.
Figure 8:
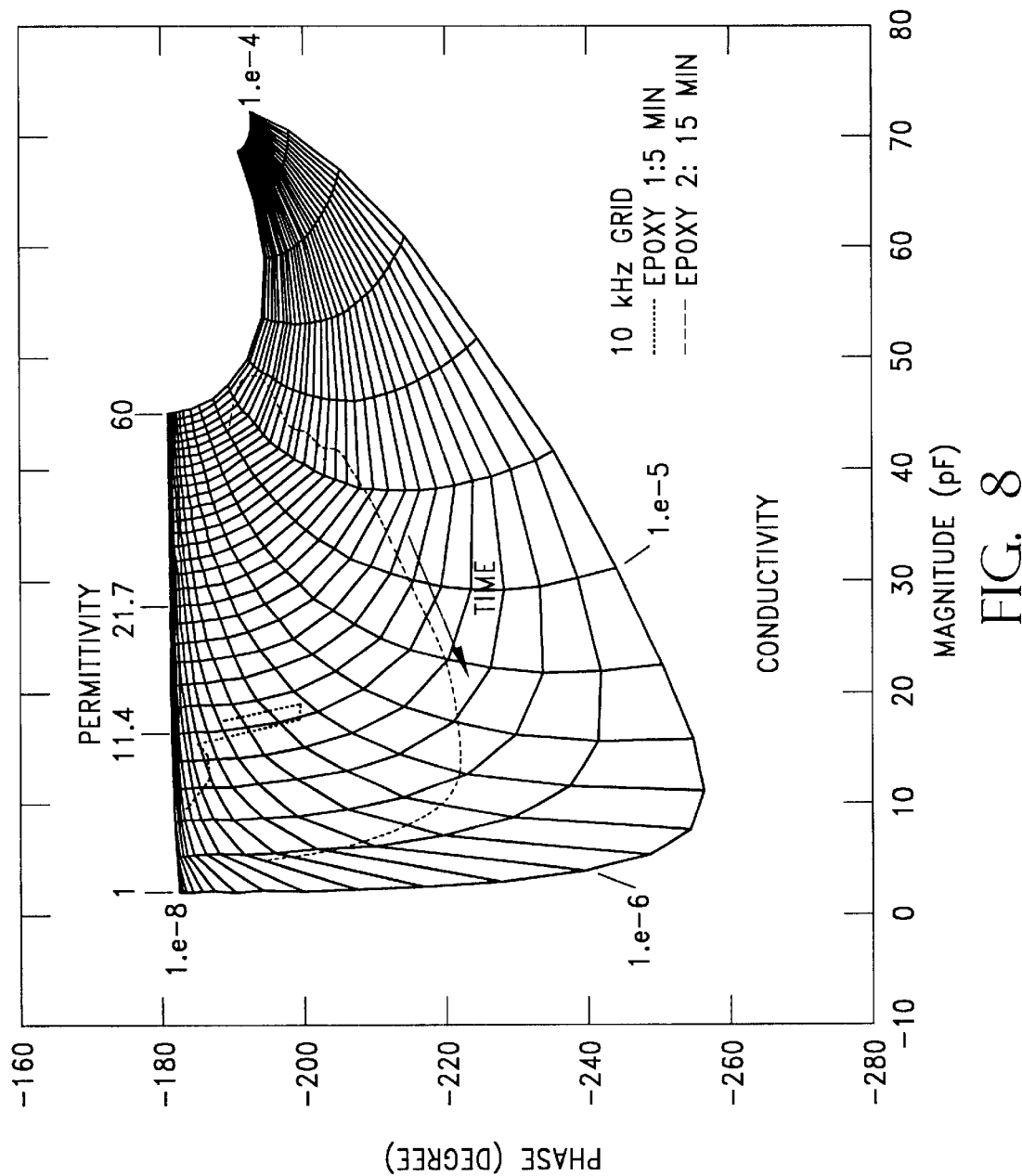
FIG. 8 shows transient measurements of the dielectric properties of two curing epoxies plotted against a measurement grid.

While property grids for the real and imaginary parts of the complex permittivity for semi-infinite materials have been generated, measurement grids have not been incorporated into the design or operation of dielectrometry measurement systems. The property grids for semi-infinite material have been used to illustrate the mapping between the model response and the measured response, but the inverse problem of estimating the properties of the material under test use iterative procedures which minimize the error (for example, the least square error) between the measure response and the response for estimate parameter. In contrast, the method of the invention uses measurement grids to estimate properties of the material under test. Different forms of measurement grids are required to solve specific problems. The measurement grids express two properties relative to each other. For example, FIG. 7 shows measurement grids for variations in the permittivity and thickness of a curing polymer layer sandwich between two protective layers and the mapping into the measureable quantities of sensor transcapacitance and thickness. This measurement grid is used in such cure state monitoring of a coating with using an independent determination of thickness. An example of a property grid is shown in FIG. 8, which shows the variations of the permittivity and conductivity of a test material (MUT) placed above a protective layer and an IDED sensor and the mapping into measurable sensor magnitude and phase.

The incorporation of geometric properties into the grids for the representation of multi-layered media, methods for measuring with and calibrating dielectrometers, the use of single and multiple grids for multiple wavenumber dielectrometry, and the use of singular value decomposition and condition numbers to improve selection amongst alternative grids and grid representation candidates, as described below. This invention also includes new methods for enhancing sensitivity and selectivity by using fluids or solids of known properties and dimensions to intentionally move the sensor response within the grid. Movement within grids, i.e., shifting of operating points, can also be achieved by varying other parameters such as temperature that also affect permittivity.

For general dielectrometry measurements of homogeneous solids, there are usually at least three unknowns that need to be determined: the material dielectric constant and conductivity and an unknown air-gap thickness between sample and sensor. This air gap can be intentional in the case of noncontact measurements or it can be the unintentional result of voids between the sample and the sensor due to sample roughness and deformation. Although these voids are usually quite small, on the order of a few micron spacing for smooth samples and greater for rough samples, the voids are located in the region of strong electric field and consequently have a significant effect on the sensor response. With a device containing two wavelength sensors, each wavelength provides two independent measurements of gain and phase, so that in most cases the four measured values give more than enough information necessary to evaluate the three unknowns. With more wavelengths, the additional redundant information can be used to further improve parameter estimations via mathematical fits, such as using a least squares fit between theory and measurements, or using single or multiple measurement grids at each frequency and averaging the results. For nonhomogeneous dielectrics, other physical parameters of interest may be the layer thickness, porosity, moisture content, or anisotropic property variations.

In some situations it is possible to simplify the measurements of the solid MUT's dielectric properties by either eliminating one of the unknown parameters or operating the sensor in a regime that is independent of one of the material properties. In the simplest case, the air gap may be negligible for a contact measurement if, for example, the MUT is fluid or soft enough to conform the sensor geometry. Then a single wavelength measurement of the transcapacitance and transconductance yields the effective permittivity and conductivity of the MUT, as in FIG. 5A. In cases where the air gap cannot be neglected, the material properties can be inferred from independent measurements with two sensors with different wavelengths if the sensors operate in a temporal frequency regime where the measurements are independent of the either the dielectric constant or the conductivity. For example, at high frequencies such that the measured admittance is only capacitive then the sensors only respond to the permittivity and thicknesses of the air gap and the MUT. Shorter wavelength sensors are more sensitive to the thickness of the air gap region, while longer wavelength sensors have fields that penetrate further into the MUT to be more sensitive to the dielectric properties of the MUT. A plot of the measured capacitances for each wavelength results in a unique measure of the MUT permittivity and equivalent air gap thickness.

Figure 6:
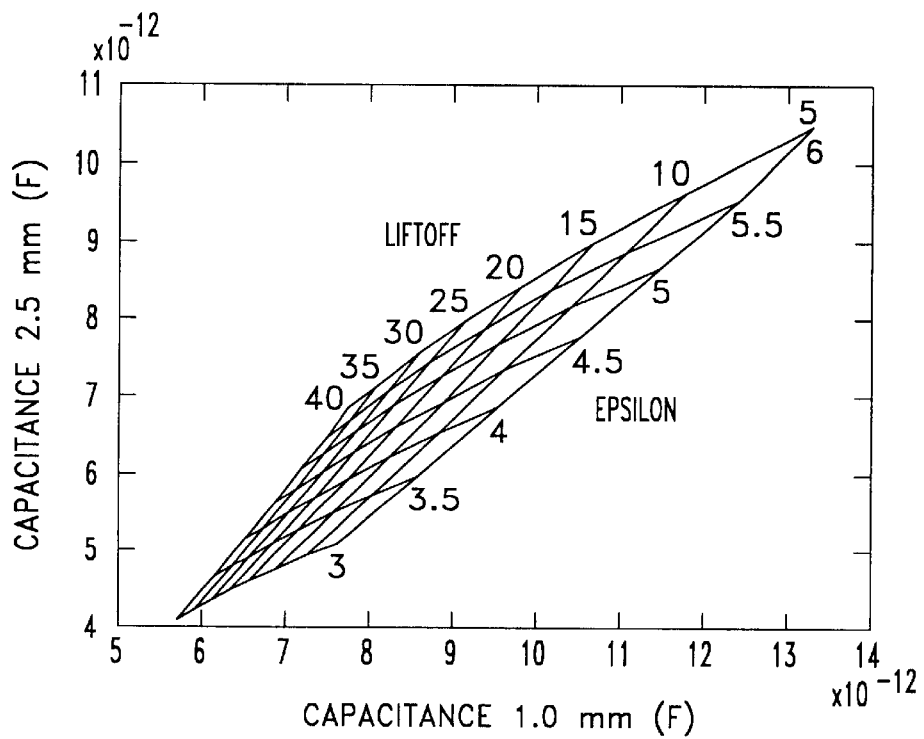
FIG. 6 shows the property estimation grid of dielectric permittivity epsilon and lift-off air gap thickness using a 1 mm and 2.5 mm two wavelength sensor.
Figure 5B:
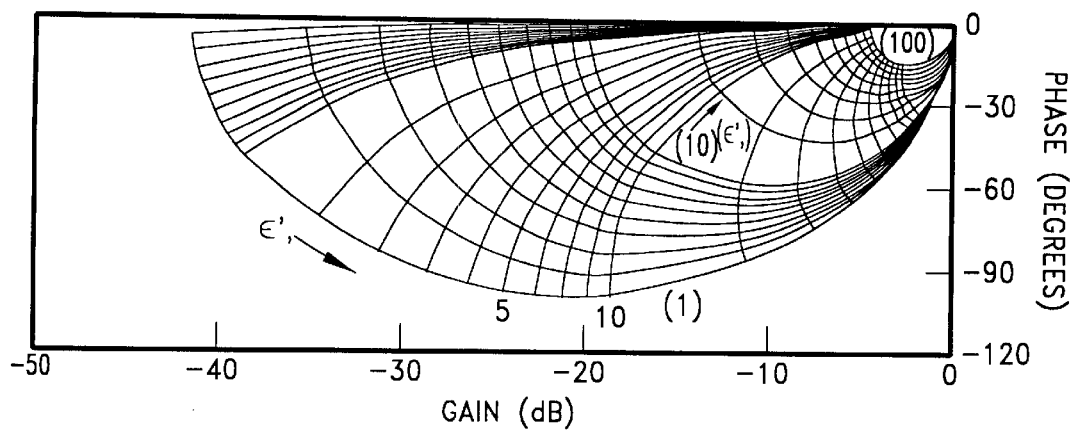
FIG. 5B shows the parameter space of complex permittivity, $\epsilon^* = \epsilon' - j\epsilon''$, in a uniform medium $j = \sqrt{-1}$ which allows calculation of $\epsilon'$ and $\epsilon''$ from gain/phase dielectrometry measurements. In the plots $\epsilon'$ and $\epsilon''$ are normalized to the dielectric permittivity of free space, $\epsilon_0 \approx 8.854E-12$ farads/meter, so that the numerical values are relative permittivities.

FIG. 6 shows a measurement grid generated for a 1 and 2.5 mm wavelength sensors, both with 0.5 m total sensor electrode length Here, a two independent spatial wavelength, high temporal frequency measurement can provide independent values for the air gap lift-off thickness and the permittivity of the MUT.

In another implementation, a single wavelength sensor can be used in combination with information from other sources to provide estimates of the solid MUT's dielectric properties. In this generalization of the measurement grid approach, variations in a dielectric or geometric property of the MUT are mapped into two measurable parameters, only one of which is from a conventional dielectrometry measurement of capacitance or conductance. The other measurable parameter, such as a layer thickness, temperature, or pressure, is an input from some other sensing device. As an example, consider a nonhomogeneous MUT consisting of four layers of insulating polymers, with the only unknown parameters being the permittivity and the thickness of the second layer away from the sensor. This represents, for example, a curing polymer layer sandwiched between two protective films and placed onto an insulating substrate. A representative measurement permittivity-thickness grid, with simulated data, is shown in FIG. 7. The expected ranking of the sample data is indicated by the circled numbers in FIG. 7. It is assumed that the thickness of the unknown layer could be measured with another device such as a micrometer. In this case, simply using the transcapacitance to infer the permittivity of the cure layer would give an incorrect ranking (2, 1, 4, 3) because of the variations in the layer thickness. Using the measurement grids to compensate for the thickness variations allows the proper ranking of the samples (1, 2, 3, 4) to be determined. It should thus be clear from this example that the measurement grids do not need to be based on a measurements from a single sensor (such as capacitance and conductance) or a single type of sensor (capacitance at one wavelength versus capacitance at a second wavelength) but rather that any combination of measurement parameters is possible.

Figure 9:
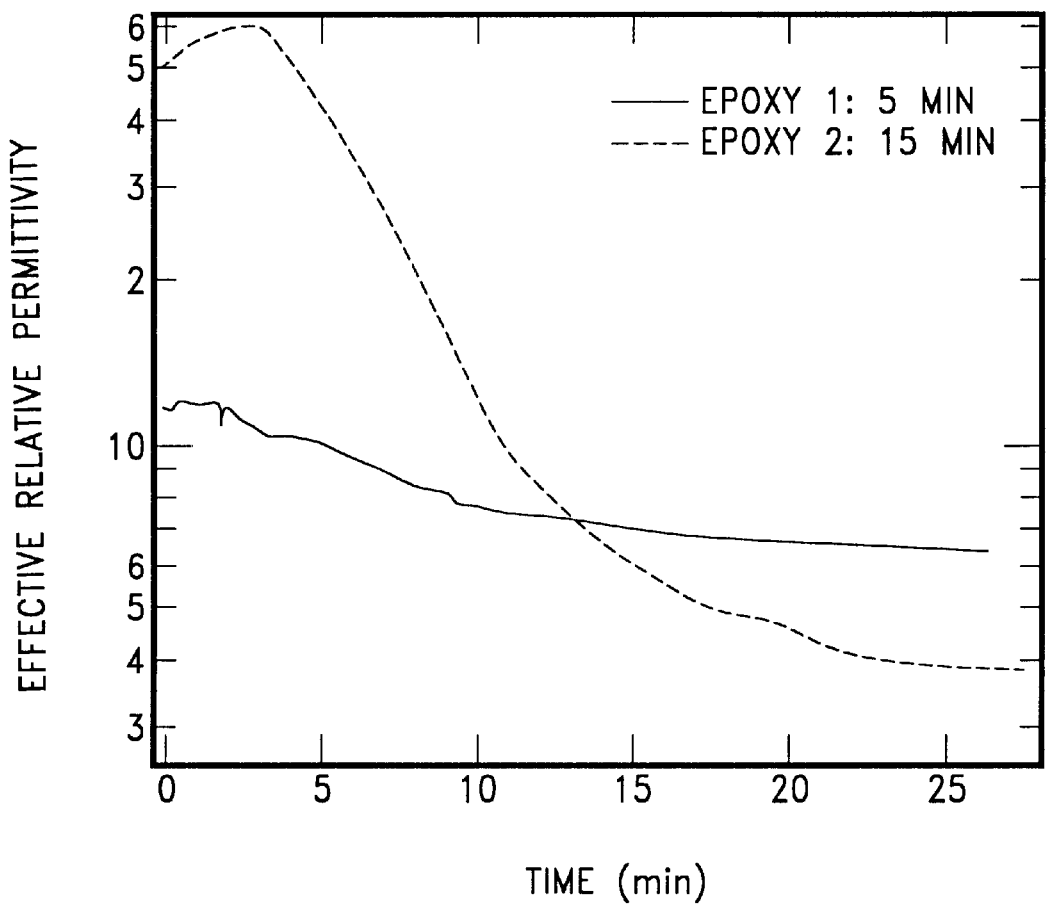
FIG. 9 shows the transient measurement of the permittivity as two epoxies cure.
Figure 10:
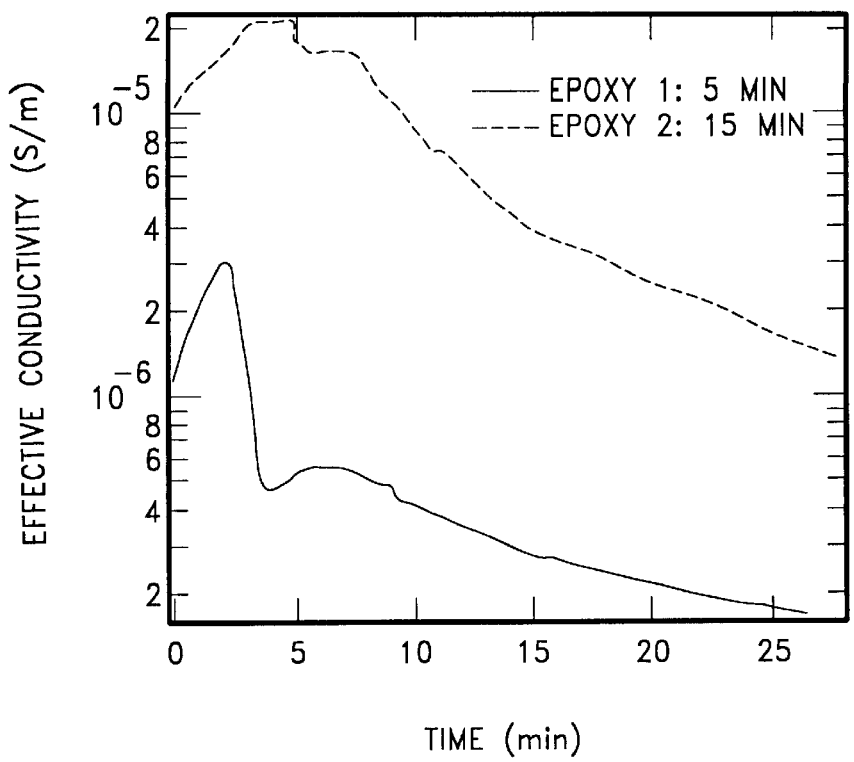
FIG. 10 shows the transient measurement of the conductivity as two epoxies cure.

One example application that illustrates the grid measurement approach is the curing of epoxies as shown in FIG. 8. In these measurements, a thick layer of epoxy was placed on a 2.5 mm wavelength sensor that was covered with a thin protective polymer layer. As the epoxy cures the dielectric properties change, with both the permittivity and conductivity generally decreasing as the cure becomes more complete. The measured sensor impedance for both a 5 and 15 minute epoxy is plotted on the measurement grid in FIG. 8. The actual transients for the epoxy dielectric properties, estimated from the measurement grid are shown in FIG. 9 for the permittivity and FIG. 10 for the conductivity. In both cases the dielectric properties change rapidly until the nominal set time is reached, after which the dielectric properties change at a slower rate. The polymer layer covered the sensor to protect the sensor and allow its reuse. In order to get accurate measurements of the epoxy properties, the measurement grids accounted for the properties of this layer. With the measurement grid created prior to data acquisition, the inversion from the measured transadmittance to the dielectric properties can be performed in real-time as part of a quality control application. Several other grids are presented to illustrate some variations on this approach, where different types of grids are generated to fit the needs of a particular application.

Figure 11:
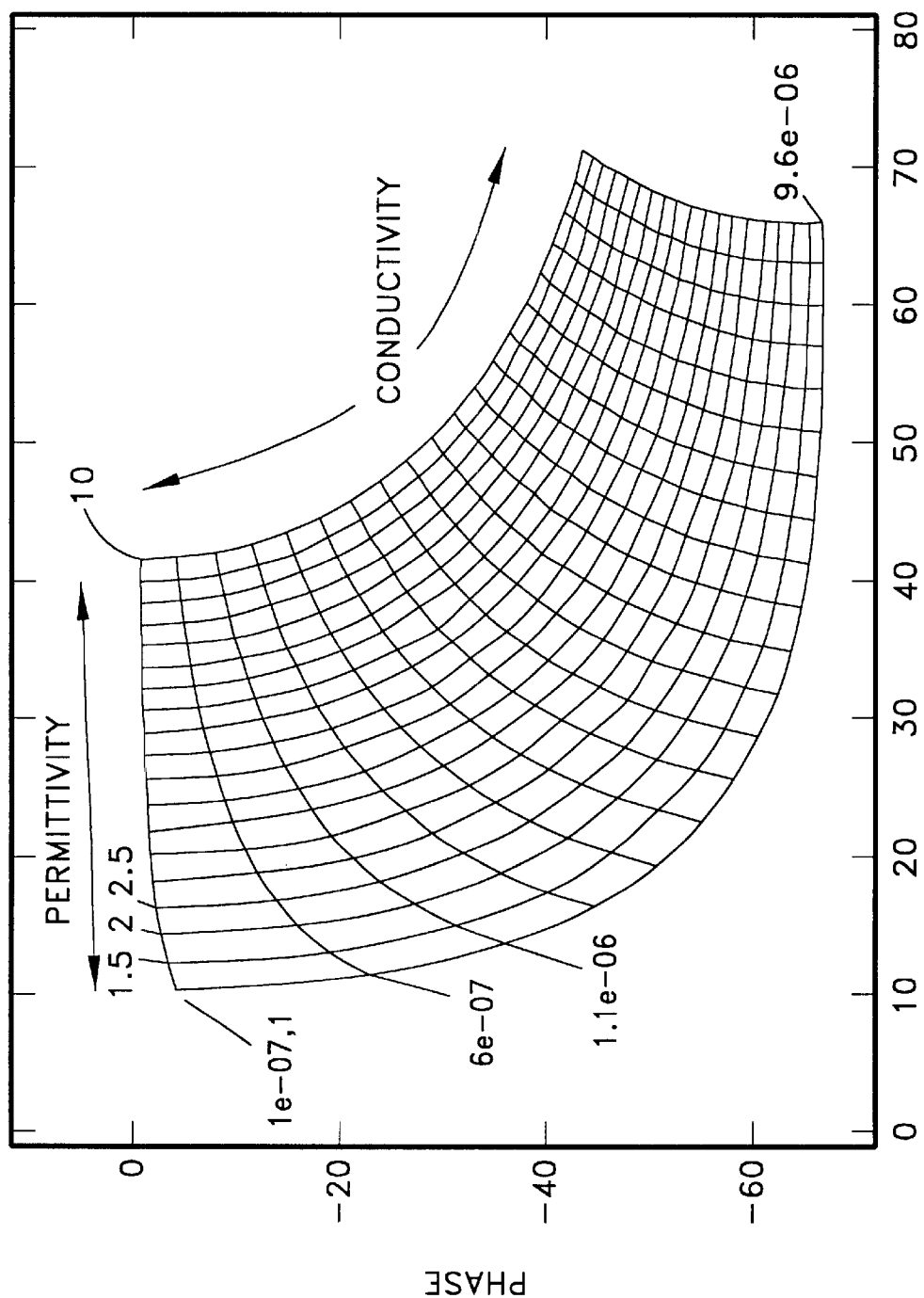
FIG. 11 shows a magnitude-phase grid for a single wavelength sensor, where the parameters being measured are permittivity and conductivity.

FIG. 11 shows a single wavelength sensor grid which can be used to measure the permittivity and conductivity of a material. With significant conductivity present there is information in the phase of the signal which can be used to estimate two quantities independently with a single sensor.

Figure 12:
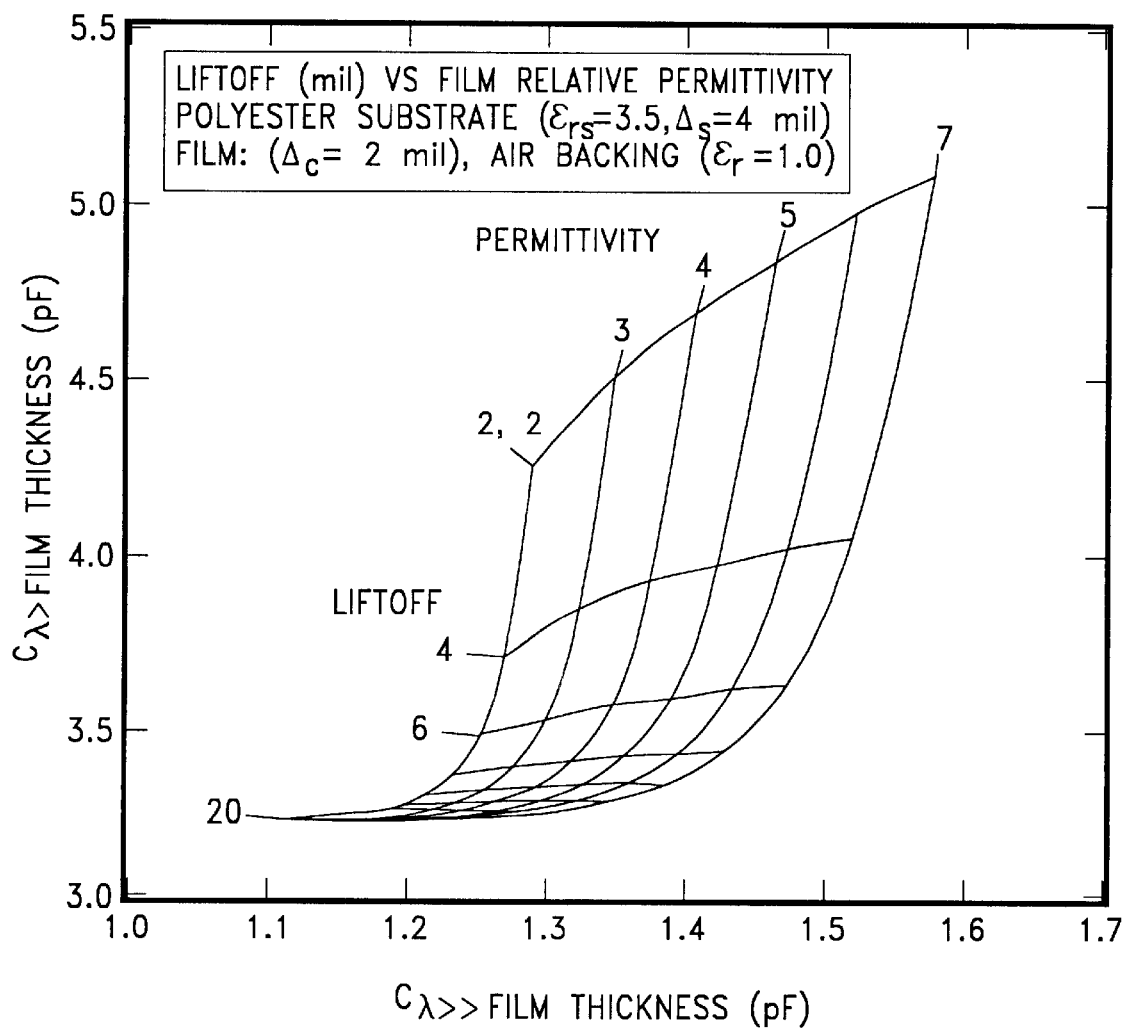
FIG. 12 shows a grid used when a non-contact measurement of a material's permittivity is performed.

In cases where the materials are insulating, the magnitude values for two separate sensors are used in a two-dimensional grid to estimate permittivity, thickness, lift-off, or other geometric parameters with two unknowns. Examples of such magnitude-magnitude grids are shown in FIG. 12 and FIG. 13. The grid in FIG. 12 is used to perform non-contact measurements of the permittivity of a dielectric coating, which is then related to other physical properties, such as cure state, porosity, etc. The grid method makes it possible to simultaneously measure the distance between the sensor head and the MUT. This is useful in providing a real-time signal which can then be used in the control of the head positioning system so that a constant separation between the sensor and the sample is maintained, e.g. when the sample is in motion. On the other hand, the fact that the lift-off is being estimated independently shows that with this grid method the measured material property is independent of the exact position of the sensor.

In a related operation, FIG. 13 shows a grid used in contact measurements. It is a magnitude-magnitude grid, where the two material properties being varied are the permittivity and thickness of the coating layer. In cases where the thickness of the coating may not be independently measured, or where this thickness is another quality control characteristic that needs to be monitored, this method provides independent information for these two MUT properties.

Figure 14:
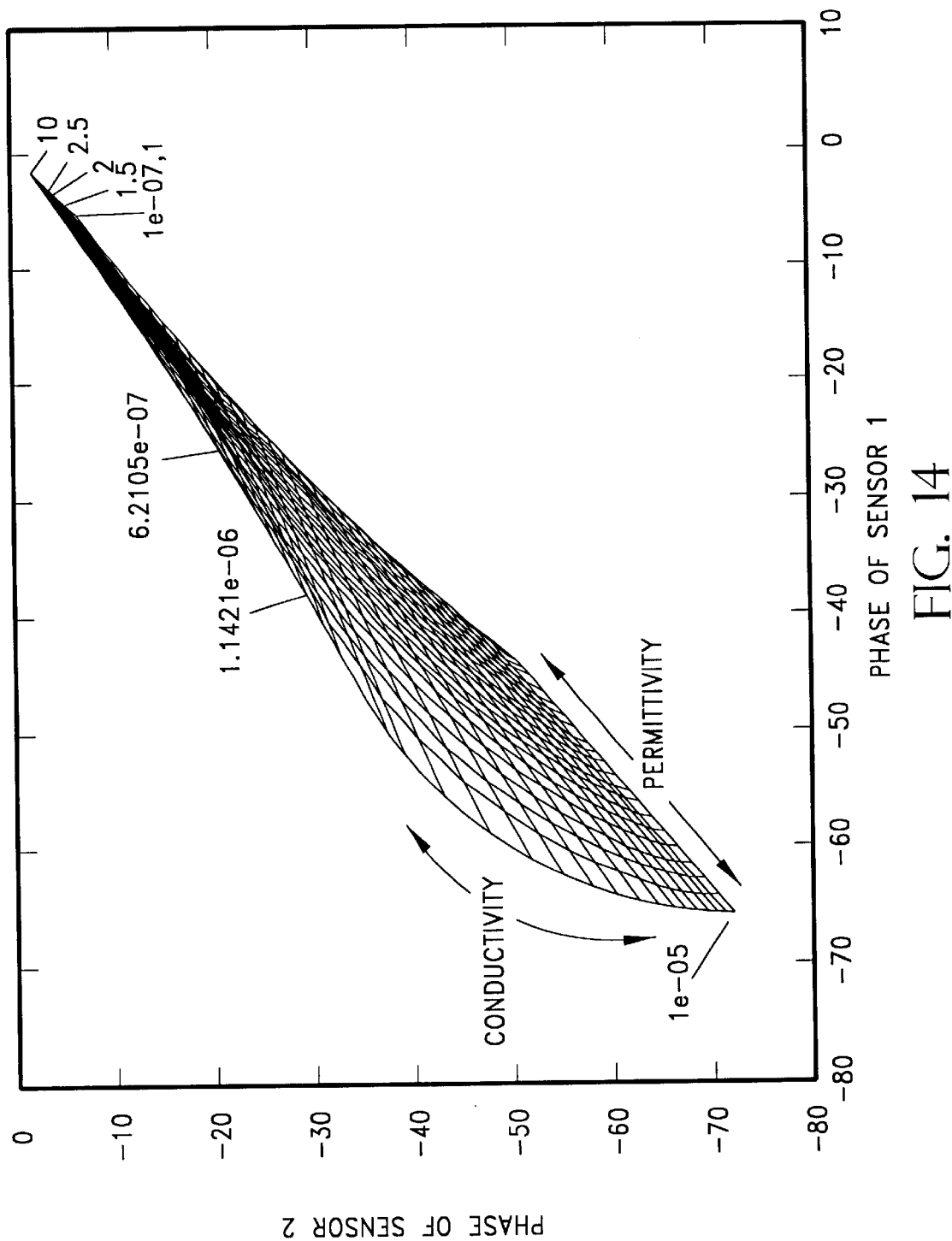
FIG. 14 shows a grid which uses phase information from two separate sensors to estimate conductivity and permittivity of a material.

FIG. 14 illustrates a different embodiment of the method whereby results from two different dielectric sensors are combined in a single grid. In this case phase of both sensors are used instead of phase and magnitude of one sensor.

In the case of a single wavelength measurement, only two measurement values (gain and phase) are determined, which are insufficient to uniquely determine three or more unknowns. A well-calibrated shim of known permittivity, conductivity and thickness can be inserted between sensor and sample; placed on the other side of the sample; or multiple precisely positioned shims including air gaps can be used. The gain/phase measurement can be repeated for any combination of these shim variations. The shim can be either solid or a fluid (liquid or gas) located between the solid MUT and the sensor. One embodiment of a liquid shim is described below with respect to FIG. 15. Multiple measurements can be performed for various thickness shims or for shims placed at various locations using a precision positioning system such as that of a piezoelectric precision positioning system These two or more independent measurements are now sufficient to estimate the various unknowns. When well-calibrated shims are used with multiwavelength sensors, the additional redundant data can be used with improved signal processing methods with multi-dimensional grids.

A variation of the calibrated shim measurement method is to use liquid dielectrics of well known permittivity, conductivity and thickness with two identical sensors. One sensor has an unknown dielectric while the second sensor uses well-calibrated known dielectrics. Well characterized miscible liquid dielectrics of precisely controlled volume are added to the calibrated sensor until the gain/phase results match those from the unknown dielectric measurement, so that geometric and physical properties of the unknown dielectric can be determined from comparison to measurements of known dielectrics.

Figure 15:
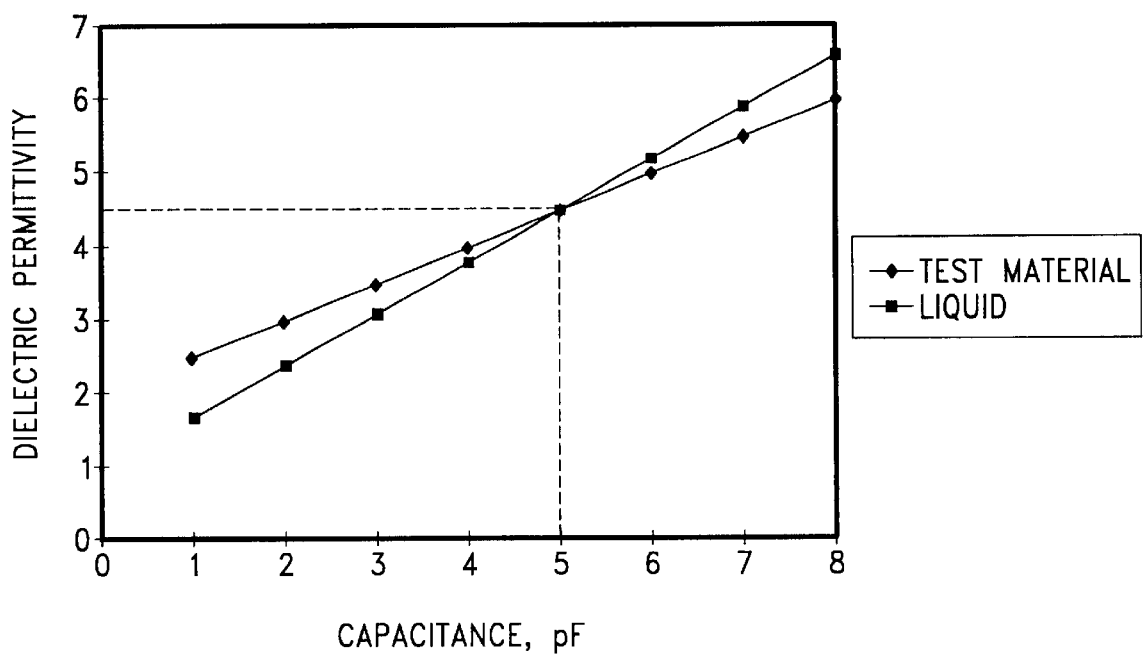
FIG. 15 shows how the dielectric permittivity of a solid material can be measured using two identical sensors with variable liquid mixtures of known permittivity to fill any air gaps.

FIG. 15 illustrates this concept with measurement of the dielectric permittivity of a solid material of arbitrary shape immersed in a liquid dielectric using two identical sensors. One is pressed against the solid test specimen, and one is immersed in the dielectric liquid. The liquid is electrically homogeneous at all times, and it can easily flow to fill in any void regions with the solid specimen. Initially, the dielectric permittivity of the liquid is lower than that of the solid, which results in the lower capacitance between the electrodes of the sensor immersed in the liquid. As a second miscible liquid with a higher dielectric permittivity is being added to the first liquid, the capacitance of both sensors increases. However, the capacitance of the liquid only sensor increases at a higher rate because it responds to the changes of properties in the entire volume, while the solid/sensor system only responds to the changes in properties of the relatively small void regions. At a certain point, the two capacitances become identical. This point corresponds to the condition that the liquid mixture dielectric permittivity equals the solid dielectric permittivity.

Generalized Material Under Test Property Estimation Framework

The method and techniques of the disclosed invention comprise a general property estimation framework. This approach is related to the one developed by Goldfine et al. in U.S. Pat. No. 5,629,621, "Apparatus and Methods for Obtaining Increased Sensitivity, Selectivity and Dynamic Range in Property Measurements using Magnetometers," the entire contents of which are incorporated herein by reference. The application to dielectrometry as opposed to magneometry is complicated by differences in both the nature of the sensing techniques and differences in the responses of materials. In magnetometry, the decay of the sensing field into the material is governed by the (vector) magnetic diffusion equation, which has partial derivatives with respect to both time and space. In contrast, dielectrometry is governed by the (scalar) Laplace's equation, which has only partial derivatives with respect to space. Thus, achieving multiple spatial decay rates with magnetometry requires changing only the temporal frequency of excitation. Achieving this same capability for dielectrometry requires specific designs in the electrode structures, as described both above and further below.

Similarly, there are differences in responses of materials; not all materials have strong magnetic or conducting responses required to interact with magnetometers, but all materials have some dielectric response. Therefore, air-gap lift-off layers, which are mere separation layers in magnetometry have more direct influence in dielectrometry, which complicates the application to measurements of solids, due to the inavoidable, and typically non-uniform, sensor lift-off. Many other, but less troublesome differences exist, which are well known to those versed in both arts, magnetometry and dielectrometry, which preclude the mechanical transferrance of methods from one domain to the other. The unavoidable lift-off layer is one of if not the most troublesome in applying this methodology to measurements of properties of solids, so several means of overcoming this obstacle are disclosed herein.

Figure 16:
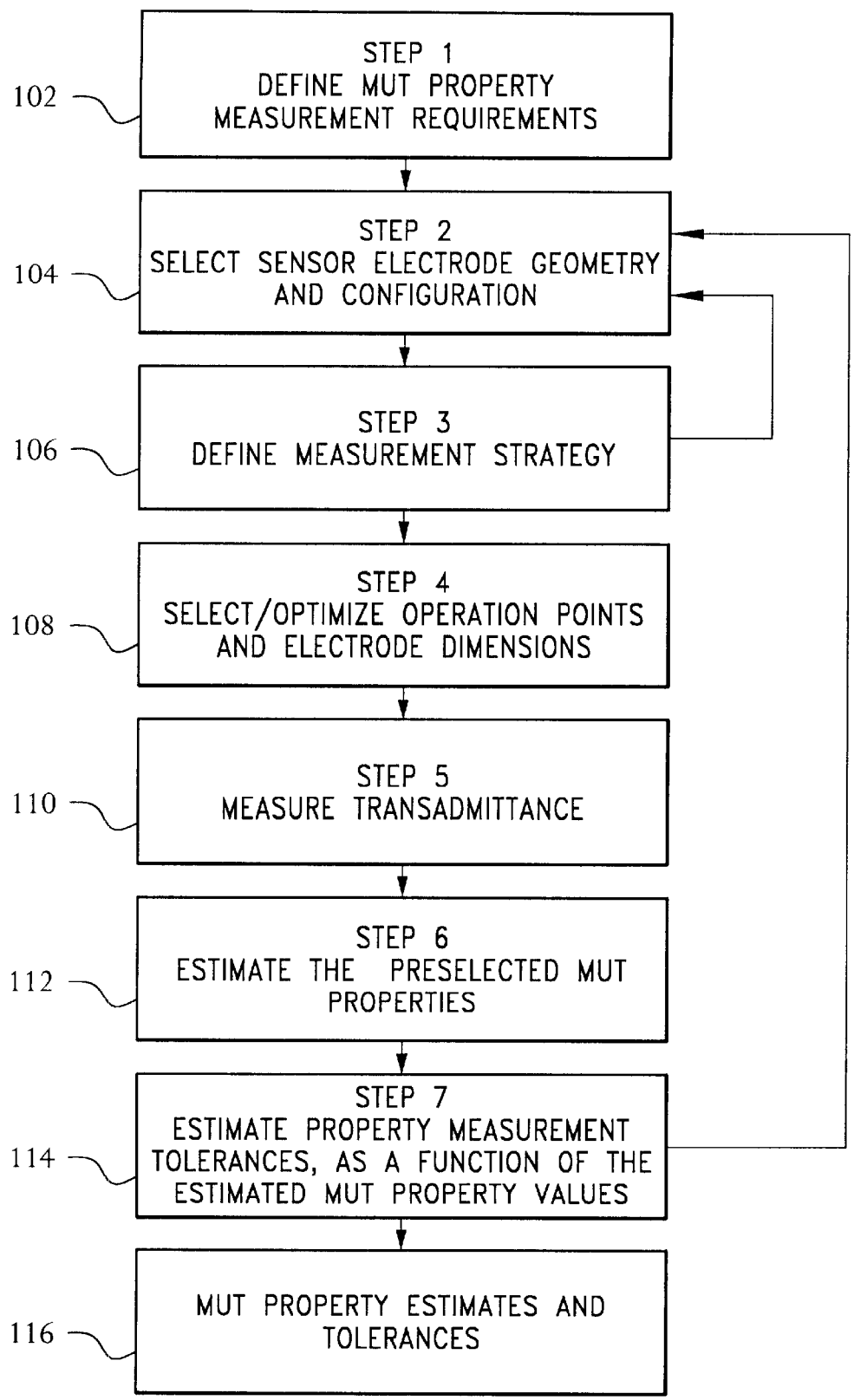
FIG. 16 is a generalized procedure flow diagram for the estimation of material under test properties and measurement tolerances according to the present invention.
Figure 17:
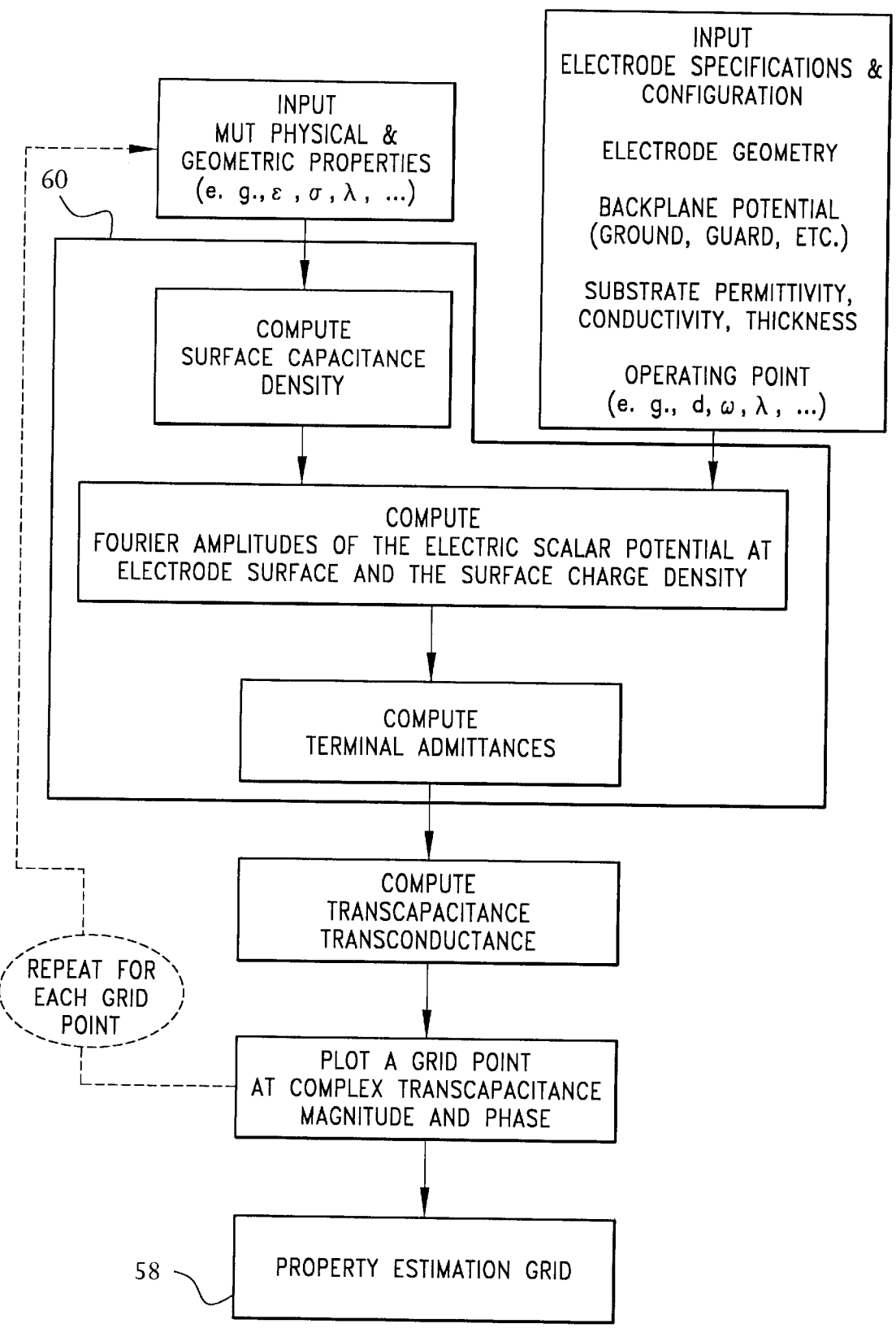
FIG. 17 is a flow diagram of the generation of a property estimation grid using a continuum model according to the invention.

A typical measurement procedure flow would include the following steps as shown in the procedure flow diagram in FIG. 16:

Step 1 (102): Define material under test (MUT) property measurement requirements-define the dynamic range and measurement tolerance requirements for the MUT properties of interest.

Step 2 (104): Select sensor electrode geometry, configuration, substrate material and dimensions, and source excitation (e.g. for the periodic electrode structure in FIG. 1 select the structure, shape, and design of the driven 34 and sensing 36 electrodes, the substrate 38, and the conducting back plane 40 geometry). Selection is based on test and evaluation of property estimation sensitivity, dynamic range, and selectivity, using the predicted responses and measurement grids 58 generated by the continuum model 60 and/or through experimental measurements on calibrated test pieces over the required range of properties for a variety of electrode geometries, substrate materials, dimensions, and configurations.

Step 3 (106): Analyze the property estimation grids and operating point responses to define the measurement strategy-the measurement strategy includes the number of measurements required at different operating points and with different sensor geometries, substrate materials, dimensions, and configurations. A continuum model 60 and/or set of experiments on calibration pieces is used to generate property estimation grids (i.e., databases) 58 and a set of response curves which are functions of operating point parameter variations. Operating point response curves include (1) the standard temporal frequency or time domain response, and responses to (2) variations in the defined electrode geometry or for the case of periodic structures the spatial wavelength of the sensor electrode construct. The defined spatial wavelength $\lambda$, the wavelength of the dominant eigenfunction, or fundamental Fourier component, in the electric scalar potential distribution and imposed along the surface of the MUT; the defined spatial wavelength can be adjusted in actual measurements by including several similar electrode constructs, each with a different defined spatial wavelength as defined in U.S. Pat. No. 4,814,690. It can also be adjusted by use of non-maximally symmetric sensors, such as shown in FIG. 18, together with varying the electrode pair (e.g., NS vs. NF vs. FS pairings) used for the measurement. (3) the relative position and kinematics of the electrode construct to the MUT including the height above or below the MUT surface, the position along the surface, the orientation relative to the surface, tilt angle and motion, and (4) adjusting the geometry of the electrode construct (including the distance between the driven and sensing electrodes), the relationship between the driving and sensing electrode widths to the wavelength $\lambda$; the relative position of the backplane 40 to the electrode plane; and in the case of nonlinear, anisotropic, or bianisotropic media the magnitude, direction, and spatial or temporal variation of an applied DC or AC bias electric and/or magnetic fields.

Step 4 (108): Determine useable and/or optimal operating point(s) and electrode dimensions-a set of operation point parameters, for one operating point, includes the proximity to the MUT, the temporal frequency, and all other adjustable parameters described in Step 3 (106). Singular value decomposition on the Jacobian matrix, relating variations in the transadmittance magnitude and phase to variations in the MUT properties of interest, is used when an accurate continuum analytical or numerical model is available to determine the relative performance potential at different operating points. If such a model is not available a set of carefully designed calibration experiments can be used, along with models of related electrode and MUT geometries to provide additional insight. Relative performance potential includes sensitivity to variations in the MUT properties of interest, selectivity for pairs of properties of interest, and dynamic range for each property of interest. Then parameter estimation grids 58, also referred to as measurement grids, are generated at optimal/selected operating points along with operating point response curves for use in property estimation in Step 6 (112).

Step 5 (110): Execute measurement strategy. Measure the transadmittance at each prescribed operating point defined in the measurement strategy, using the admittance analyzer 44.

Step 6 (112): Estimate the preselected MUT properties-estimate the MUT properties of interest, using, for example, root-searching techniques, trial and error, table look up and interpolation; and/or graphical interpolation from measurement grids 58 generated with simulations, i.e. continuum model, 60 and/or calibration experiments. This is accomplished in the property estimator 46.

Step 7 (114): Estimate the property estimation tolerances-using measurement grids 58 and operating point response curves generated with the continuum model 60 (or calibration experiments) and the measurement tolerances and tolerance variations over the dynamic range of interest for each pre-selected MUT property of interest. If the property estimation measurement requirements are not achieved (116), repeat Steps 2 (104) through 7 (114).

For any application, calibration experiments can be used to tune the model parameters and improve MUT property estimation accuracy. Such calibration, although not always required, should always be used when available.

Property Estimation Grid Database and Operating Point Response Curve Generation

Each parameter estimation application will require a set of property estimation grids, i.e., databases/measurement grids 58 and operating point response curves. The number of grids and response curves required will depend on the application. The grids and response curves have several different uses throughout the parameter estimation process. These uses include the following:

1) Develop a measurement strategy and select the measurement operating points by evaluating the MUT property estimation grids and operating points response curves, at a variety of different operating points over the required dynamic range for the MUT properties of interest (Step 3 (106): of the generalized MUT property estimation procedure in FIG. 16). Evaluating a property estimation grid includes investigating the sensitivity, selectivity and dynamic range for the MUT properties of interest. This is first accomplished by visually inspecting the grids. For example, a grid which provides a large variation in the magnitude and phase of the transcapacitance in response to relatively small variation in the MUT properties of interest would provide a good property estimation performance. This is discussed further in the next section, where the use of singular value decomposition is described as an automated method for identifying the "best" operating points, as well as determining the dynamic range over which sensitivity requirements can be met for measurement of specific MUT properties of interest.

2) Graphical estimation of the MUT properties of interest (Step 6 (112): of the generalized MUT property estimation procedure in FIG. 16). For example, in FIG. 5A for a 2.5 mm wavelength IDED structure, the transcapacitance and transconductance are calculated over a range of conductivities and permittivities, while in FIG. 6 the transcapacitances are calculated for 1 mm and 2.5 mm wavelength IDED structures over a range of permittivities and lift-off distances. The conductivity and permittivity for the case of FIG. 5A or the permittivity and lift-off distance for the case of FIG. 6 are then estimated from each measurement for FIG. 5 or pair or measurements for FIG. 6. Alternatively, the grids are used to obtain first guesses for the conductivity, permittivity, or lift-off distance and then the parameter estimated values are adjusted until the least squares error between the measured transcapacitance and/or transconductance and the response for the estimated permittivity, conductivity or lift-off is minimized.

3) Determination of the estimate tolerances, as a function of the estimated values for the MUT properties of interest (Step 7 (114): of the generalized MUT property estimation procedure in FIG. 16). The tolerances at a given grid point are estimated by averaging the variation in transadmittance magnitude and phase between that grid point and its neighboring grid points and dividing both by the average change in magnitude and the average change in phase into the corresponding change in the MUT property of interest. For example, if a change in dielectric thickness of 1 mm causes a phase change of 10 degrees, the sensitivity is 1 degree per 0.1 mm. If the admittance analyzer 44 can accurately measure phase to 0.1 degrees then a 0.1 degree change in transadmittance phase would correspond to a 0.01 mm change in thickness. In other words, the limit on the measurement precision for dielectric thickness for this example would be 0.01 mm (the actual tolerances will vary significantly with operating point specifications, MUT properties, and electrode construct, geometry, and dimensions). Also, the value of the measurement tolerance will vary with the MUT property estimate value over the dynamic range for the MUT properties of interest. The reported measurement tolerance should also include the effects of other inherent errors due to unmodelled dynamics. These errors could be determined for each sensor and model, using calibration test pieces.

4) Provide comparison and evaluation of measurement strategy options. All too often measurements are performed with inadequate understanding of whether the measurement strategy (a.k.a., protocol, methodolgy) is adequate to the task, what properties the strategy has, whether such properties of the strategy could be improved or are already optimal. In situations where measurements of certain kinds have been needed for years, or decades, ad-hoc standards and rules of thumb have often accumulated. Often they are sanctified by various standards bodies. In the absence of means of evaluating and comparing measurement strategies, this is the best that can be expected. But in measurement domains where means of evaluating and comparing measurement strategies have been developed, ad-hocracy has been supplanted with objective evaluation. This has occurred long since for many simple measurements, e.g., circuit measurement of voltage or impedance. The methods disclosed herein, and their obvious extensions, now enable the choice of dielectrometry measurement strategies to be made on objective scientific bases, instead of rules of thumb and ad-hoc techniques. It is the analysis of the properties of measurement grids and operating response curves, such as condition numbers and singular value decompositions, when applied to comparison and selection of measurement strategies and the details that comprise such strategies, that enables objective comparisons and rational choices.

FIG. 18 provides a flow diagram describing the generation of a property estimation grid or measurement grid 58, using an analytical or numerical continuum model 60. The same concepts described in this figure apply to the generation of operating point response curves. The only difference is that for property estimation grids the main loop is repeated for different MUT property pairs (e.g. permittivity and conductivity, permittivity and lift-off or conductivity and lift-off), while for the generation of operating point response curves one operating point parameter is varied over a range of interest (i.e. an operating point response curve is generated by computing the transadmittance response for each incremented value of one operating point parameter, with all other operating point parameters held constant). An operating point response curve is generally a one-dimensional grid, where the variable is an adjustable operating point parameter (e.g., lift-off, frequency, or wavelength) instead of a preselected MUT property (two-dimensional grids that permit properties to vary, e.g., lift-off and wavelength are also valuable). The air gap lift-off height is generally considered an operating point parameter. However, in many applications it is more convenient to consider the lift-off eight as a MUT property of interest.

Fringing Field Multi-Penetration Depth Dielectrometry Sensor with Common Lift-Off Height The property estimators with multi-penetration depth dielectrometry sensors can be most accurate if the lift-off height for each electrode configuration is the same. This can be achieved with a three electrode fringing field dielectrometry sensor 120 shown in FIG. 18A. Each set of finer electrodes 122, 124, and 126 can be used sequentially as drive, sense, and guard electrodes. The electrode 122 and the electrode 126 are multifingered and are arranged with the multifingers of the electrode 122 interdigitated with the multifingers of the electrode 126. The electrode 124 meanders between the two interdigitated electrodes 122 and 126. Even though the fundamental spatial wavelength of each configuration is the same, the relative amplitudes of each of the spatial harmonics will change with each configuration. To maximize the difference in harmonic amplitudes and thereby maximally change the effective penetration depths of the electric field, it is best to maximize the distances from the center electrode to the electrodes on either side. One way to calculate this optimum spacing is to use a "golden section". If the sensing electrode is in the center (such as 124 in FIG. 18A), donate the electrode on one side (such as 126 in FIG. 18A) a distance x away as "far" and the electrode on the opposite side (such as 122 in FIG. 18A) a distance a−x as "near", so that the distance from "far" to "near" electrodes is a, then a "golden section" is defined such that x is the geometric mean of a and a−x, $x=[a(a-x)]^{1/2}$ so that $x=a(\sqrt{5}-1)/2 \approx 0.618a$. With this "golden section", the ratio of distance of "far" to "sense" (FS) electrodes to "sense" to "near" (NS) electrodes equals the distance ratio of "far" to "near" (FN) electrodes to "far" to "sense" (FS) electrodes, the ratio being $\approx 1.618$.

Figure 18A:
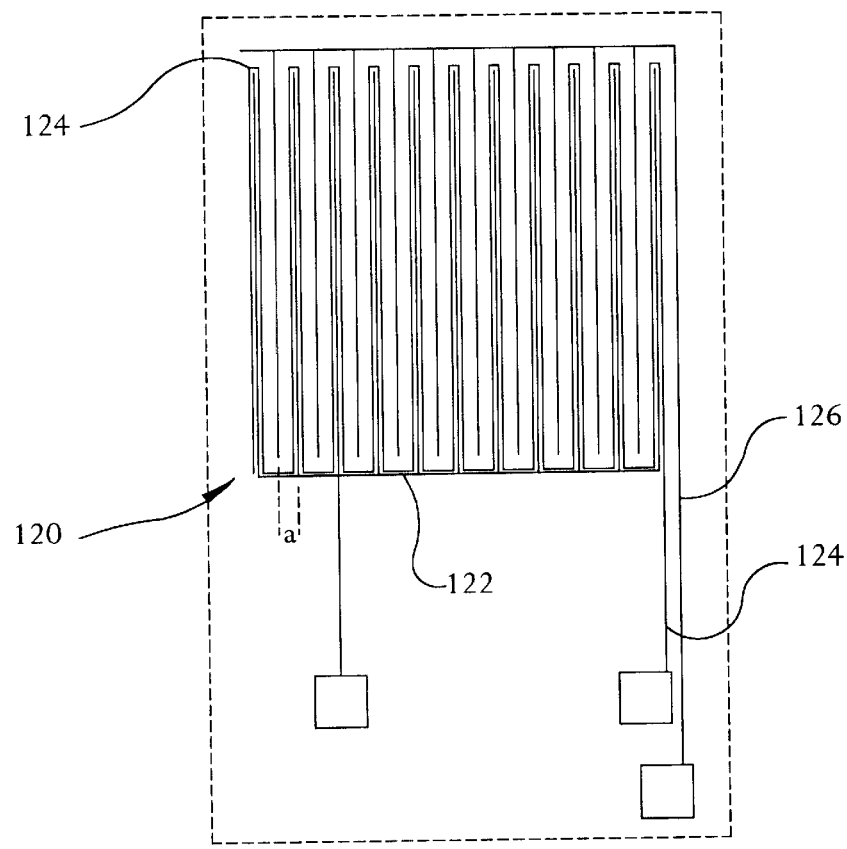
FIG. 18A illustrates a dielectrometry sensor having three sets of electrodes which alternate roles of drive, sense, and guard electrodes.
Figure 18B:
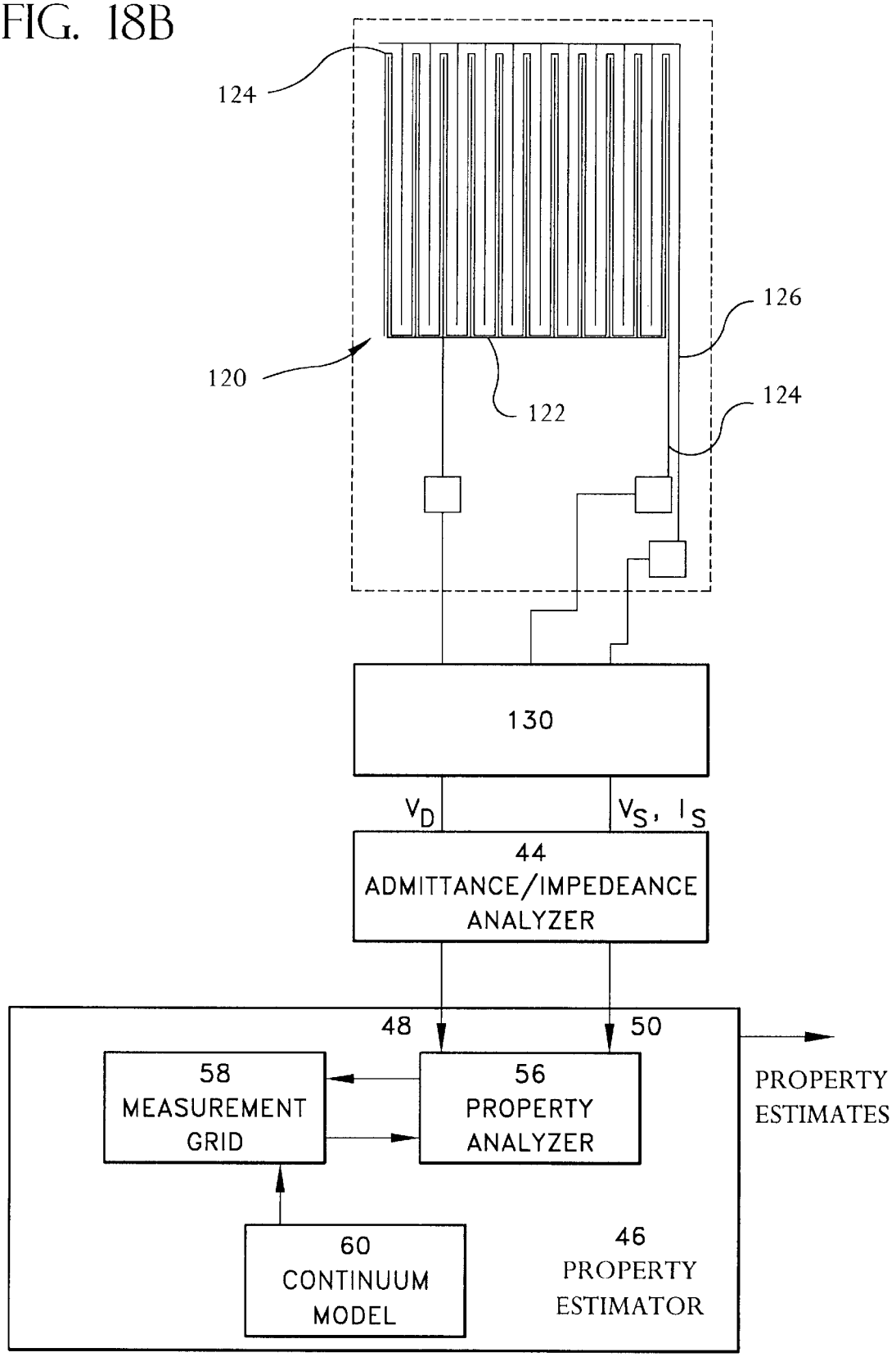
FIG. 18B is a schematic of the dielectrometry sensor of FIG. 18A and a switching device connected to an admittance analyzer.

The configuration of FIG. 18A is significantly different than those proposed in the prior art. U.S. Pat. No. 4,814,690 by Melcher et al. discloses switching the individual elements of the interdigitated structure between driven and sensing to vary the fundamental wavelength of the measurement, this requires a switch for every element in the sensor, while the configuration of FIG. 18 only requires switches to be placed at the terminals. The configuration of FIGS. 18A and 18B switches the roles of the drive, sense, and guard electrodes to intentionally vary the penetration depths of the electric field. A switching device 130 connects the sensor 122 to the admittance analyzer 44.

Figure 19:
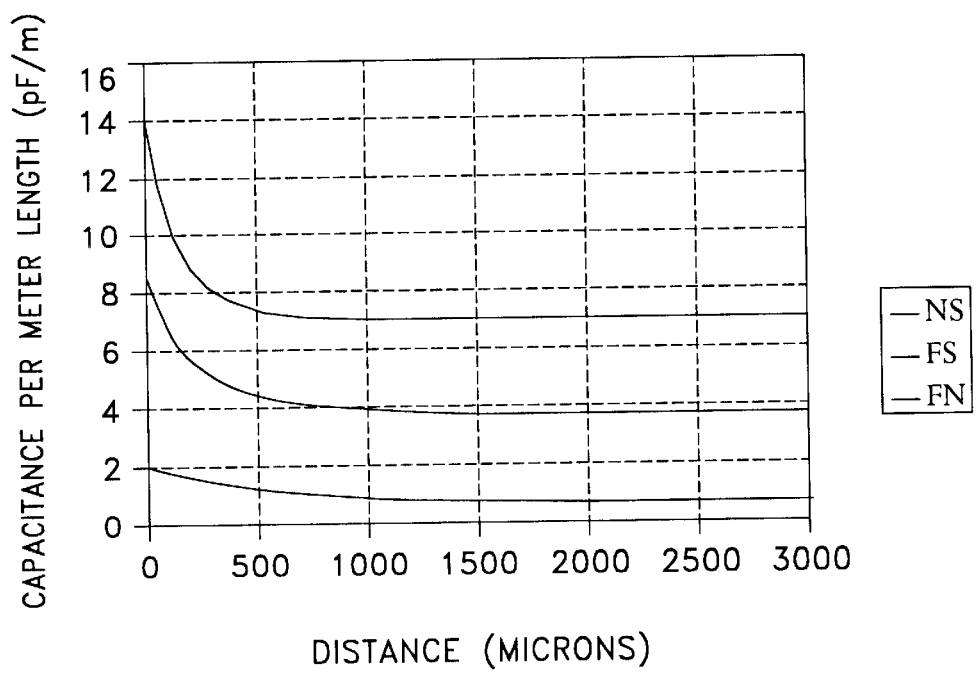
FIG. 19 shows the calculated capacitance per meter versus air-gap lift-off height of the three configurations of the sensor in FIG. 18 whereby the electrode widths are all 500 μm, and the distance between electrode centerlines in a half-wavelength is 2470 μm (FN), 1530 μm (NS), and thus 4000 μm (FS)
Figure 20:
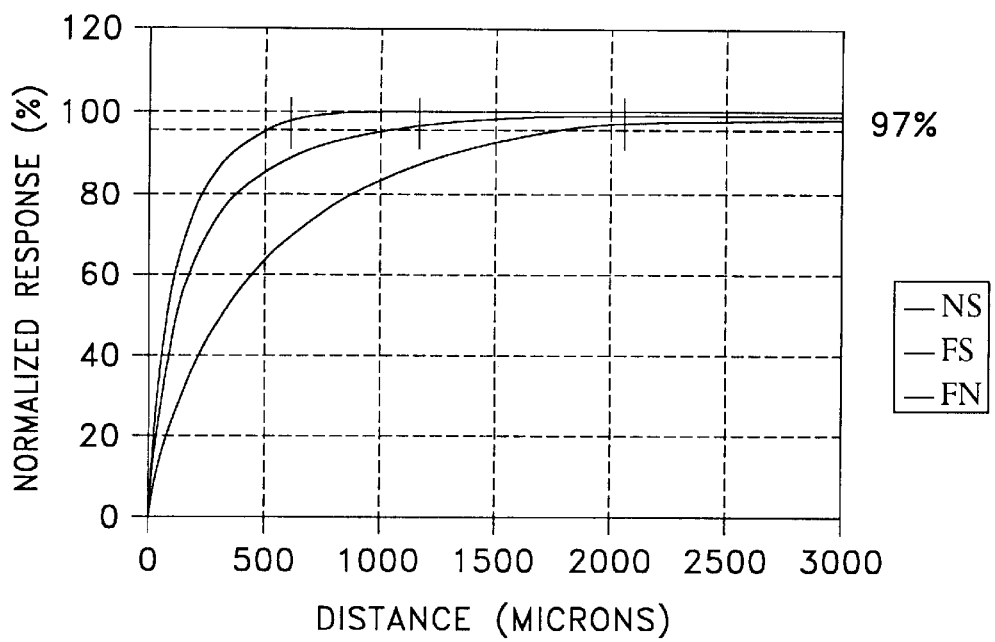
FIG. 20 normalizes the calculated capacitance curves in FIG. 19 to the difference between zero distance and infinite distance.

The sensor topology of FIG. 18A was used with electrode widths of 500 $\mu$m; FN centerline distance of 2470 $\mu$m, NS centerline distance of 1530 $\mu$m, and thus a FS centerline distance 4000 $\mu$m; substrate thickness of 254 $\mu$m; electrode thickness of 17 $\mu$m, substrate relative permittivity of 2.2; and a relative permittivity of an adjacent dielectric of 3.0. FIG. 19 shows the calculated capacitance variation with air-gap lift-off height for each possible pair of electrodes (NS, PS, FN). To compare the variations for each of the electrode configurations it is convenient to normalize the capacitances to the difference of capacities at zero lift-off (no air-gap) to infinite life-off height (all air-gap) as shown in FIG. 20. The effective penetration depth can be defined as that lift-off height when the capacitance reached 97% if its infinite lift-off height value, as shown by the 97% line in FIG. 20. As seen in FIG. 20 the effective penetration depths are then 570 $\mu$m (NS), 1180 $\mu$m (FN), and 2020 $\mu$m (FS).

Figure 21:
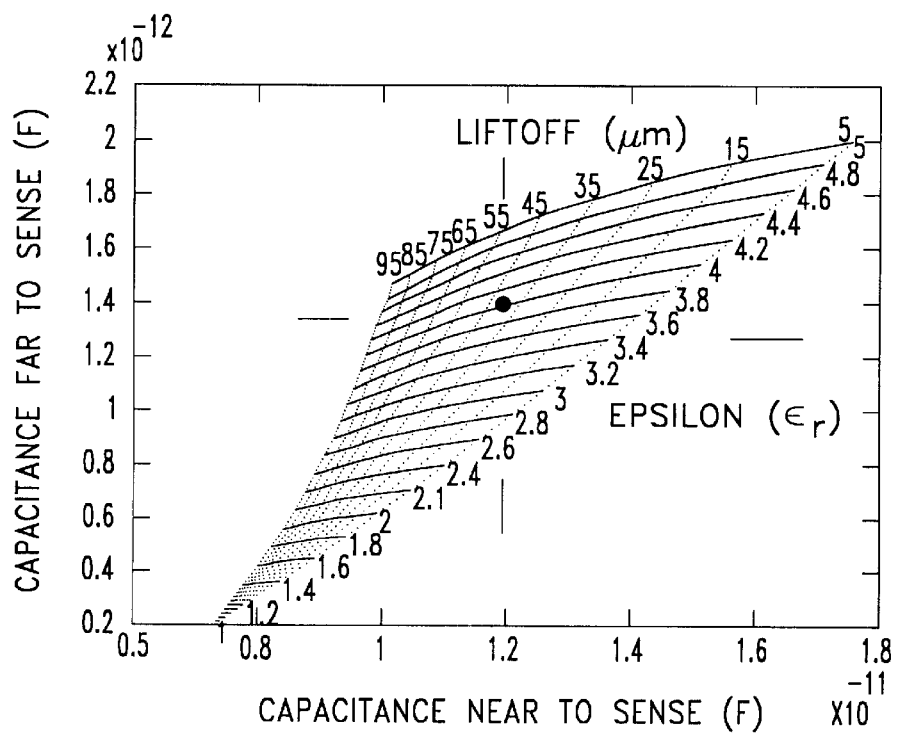
FIG. 21 shows the calculated capacitance grids of near to sense (NS) electrodes as a function of air lift-off height in mm and relative permittivity for the 8 mm wavelength sensor dimensions given in FIG. 19.

FIG. 21 shows the calculated grid for a loss-free dielectric for an 8 mm wavelength sensor with the dimensions of the previously described design The grid shows how from measurements of the "FS" and "NS" capacitances, the air-gap lift-off height in $\mu$m and dielectric permittivity can be determined. For example, if the measured near to sense capacitance is 12 pF and the measured far to sense capacitance is 1.4 pF, then plotting the measured value on the grid of FIG. 21 and interpolating along the grid lines gives property estimates of 35 $\mu$m for the lift-off and 3.8 for the relative permittivity.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A sensor for measuring properties of a material under test comprising:

at least three electrodes disposed in proximity to a material under test, at least two of the electrodes being arranged as multifingered interdigitated electrodes with at least another electrode meandering between the interdigitated electrodes, at least one of the electrodes driven by an electrical signal, and at least two of the other electrodes sensing an electric field;

driver terminal means for connecting said driven electrode to electrical signal generating devices and means for creating the electrical signal that results in an electric field which couples to the sensing electrodes through the material under test; and sensor terminal means for connecting said sensing electrodes to means for receiving the sensed electrical signal so that the electric field can penetrate into the material under test with more than one effective field penetration depth.

2. A sensor as claimed in claim 1 wherein the sensor electrodes have a periodic structure of three electrodes and the sensor electrodes are alternately switched between drive, sense, and ground or guard.

3. A sensor as claimed in claim 2 wherein the electrodes have centerline spacings which are equal to or approximate a "golden section".

4. A sensor as claimed in claim 1 further comprising means for switching between electrode connections.

5. A sensor as claimed in claim 1 wherein one of the interdigitated electrodes is a drive electrode.

6. A sensor as claimed in claim 5 wherein another of the interdigitated electrodes is a sense electrode and the meandering electrode is an additional sense electrode.

7. A sensor as claimed in claim 1 wherein the at least one meandering electrode is a drive electrode.

8. A sensor for measuring properties of a material under test comprising:

a first multifingered interdigitated electrode and a second multifingered interdigitated electrode; and a third electrode that meanders between the first and the second multifingered interdigitated electrodes, the spacing between the third electrode and the first electrode being different than the spacing between the third electrode and the second electrode, the different spacings of the three electrodes providing for two depths of measurements into the material under test.

* * * * *

UNITED STATES PATENT AND TRADEMARK OFFICE
CERTIFICATE OF CORRECTION

PATENT NO.    : 6,380,747 B1
DATED         : April 30, 2002
INVENTOR(S)   : Neil J. Goldfine, Markus Zahn, Alexander V. Mamishev, Darrell E. Schlicker and Andrew P. Washabaugh It is certified that error appears in the above-identified patent and that said Letters Patent is hereby corrected as shown below:

Column 18,
Line 18, delete "multifmgered" and insert -- multifingered --.

Signed and Sealed this

Sixteenth Day of July, 2002

Attest:

JAMES E. ROGAN
Attesting Officer
Director of the United States Patent and Trademark Office